United States Patent
Saito et al.

[11] Patent Number: 5,716,719
[45] Date of Patent: Feb. 10, 1998

[54] MAGNETORESISTANCE EFFECT ELEMENT

[75] Inventors: Yoshiaki Saito; Koichiro Inomata, both of Yokohama; Susumu Hashimoto, Ebina, all of Japan

[73] Assignee: Kabushiki Kaisha Toshiba, Kawasaki, Japan

[21] Appl. No.: 190,571

[22] Filed: Feb. 2, 1994

Related U.S. Application Data

[63] Continuation of Ser. No. 913,644, Jul. 14, 1992, abandoned.

[30] Foreign Application Priority Data

| Jul. 30, 1991 | [JP] | Japan | 3-190033 |
| Oct. 23, 1991 | [JP] | Japan | 3-302598 |
| May 27, 1992 | [JP] | Japan | 4-135196 |

[51] Int. Cl.$^6$ ............ H01F 1/00; B32B 15/00
[52] U.S. Cl. ............ 428/611; 428/628; 428/632; 428/928; 428/675; 428/676; 428/672; 428/673; 428/674; 428/680; 428/681
[58] Field of Search ............ 428/611, 635, 428/621, 632, 628, 630, 623, 675, 928, 694, 900, 698, 704

[56] References Cited

U.S. PATENT DOCUMENTS

| 3,350,180 | 10/1967 | Croll | 428/928 |
| 4,949,039 | 8/1990 | Grunberg . | |
| 5,134,533 | 7/1992 | Friedrich et al. | 360/113 |
| 5,366,815 | 11/1994 | Araki et al. | 428/611 |
| 5,523,172 | 6/1996 | Saito et al. | 428/611 |

FOREIGN PATENT DOCUMENTS

| 0 063 397 | 10/1982 | European Pat. Off. . |
| 0 406 060 | 1/1991 | European Pat. Off. . |
| 0406061 | 1/1991 | European Pat. Off. . |
| 0 442 407 | 8/1991 | European Pat. Off. . |
| 0 498 344 | 8/1992 | European Pat. Off. . |
| 0504473 | 9/1992 | European Pat. Off. . |
| 3150881 | 6/1991 | Japan . |
| WO 92/15102 | 9/1992 | WIPO . |

OTHER PUBLICATIONS

Sato, et al.; Galvanomagnetic Properties of Ag/M (M=Fe, Ni, Co) Layered Metallic Films, Superlattices & Microstructures, vol. 4, No. 1, 1988, pp. 45–50.

Parkin, et al.; Oscillations in Exchange Coupling and Magnetoresistance in Metallic Superlattice Structures: Co/Ru, Co/Cr, and Fe/Cr; Physical Rev. Letters, vol. 64, No. 19, 1990, pp. 2304–2307.

Baibich, et al.; Giant Magnetoresistance of (001) Fe/(001) Cr Magnetic Superlattices; vol. 61, No. 21; 1988; pp. 2472–2475.

Russell Drago, "Physical Methods in Chemistry", pp. 412–413 (undated).

L. Solymar, et al., "Lectures on the Electrical Properties of Materials", pp. 317–318 (undated).

Kirk–Othmer, "Encyclopedia of Chemical Technology" 3rd Ed. vol. 14, 1981, p. 647.

Journal of Magnetism and Magnetic Materials 94 (1991) L1–L5, North–Holland; D.H. Nosca, et al; "Oscillatory Interlayer Coupling and Giant Magnetoresistance in Co/Cu Multilayers".

(List continued on next page.)

Primary Examiner—James Engel
Assistant Examiner—Linda L. Gray
Attorney, Agent, or Firm—Oblon, Spivak, McClelland, Maier & Neustadt, P.C.

[57] ABSTRACT

A multilayer comprising magnetic layers and nonmagnetic layers, which are stacked in a manner to produce a magnetoresistance effect, is formed on a main surface of a substrate having at least the surface portion formed of a single crystal of cubic system. The (110) plane of said single crystal constituting the main surface of the substrate. The magnetic layers are distorted such that a uniaxial easy axis of magnetization is formed within a plane.

14 Claims, 19 Drawing Sheets

OTHER PUBLICATIONS

Journal of the Physical Society of Japan, vol. 59, No. 9, Sep. 1990; pp. 3061–3064, T. Shinjo et al.; "Large Magnetoresistance of Field Induced Giant Ferrimagnetic Multilayers".

Patent Abstracts of Japan, vol. 16, No. 117 (P–1328) [5160], Mar. 24, 1992, & JP–A–03 286 413, Dec. 17, 1991, S. Mitani, "Magneto–Resistance Effect Type Head".

Patent Abstracts of Japan, vol. 12, No. 284, (P–740) [3131], Aug. 4, 1988, & JP–A–63–63117, Mar. 19, 1988, H. Tanaka, "Thin Film Magnetic Head".

Patent Abstracts of Japan, vol. 12, No. 284, (P–740) [3131], Aug. 4, 1988, 7 JP–A–63–63116, Mar. 19, 1988, H. Tanaka, "Thin Film Magnetic Head".

Patent Abstracts of Japan, vol. 10, No. 210, (P–479) [2266], Jul. 23, 1986, & JP–A–61–50203, Mar. 12, 1986, M. Nakajima, et al., "Production of Magnetic Head".

Physical Review B, Condensed Matter, vol. 43, Third Series, No. 1–B, Jan. 1, 1991, pp. 1297–1300, B. Dieny, et al., "Giant Magnetoresistance in Soft Ferromagnetic Multilayers".

Parkin et al.; Appl. Phys. Lett. 58(23); 10 Jun. 1991; pp. 2710–2712; Giant Magnetoresistance in Antiferromagnetic Co/Cu Multilayers.

Cebolloda et al.; Physical Review B; vol. 39, No. 13; 1 May 1989; pp.9726–9729; Antiferromagnetic Ordering in Co–Cu Single–Crystal Superlattices.

"Recent Advances in Molecular Bean Epitaxy of Metallic Multilayers Superlattices" Nguyen–Van–Dou, Physical Review 25 (1990) Oct., pp. 971–976.

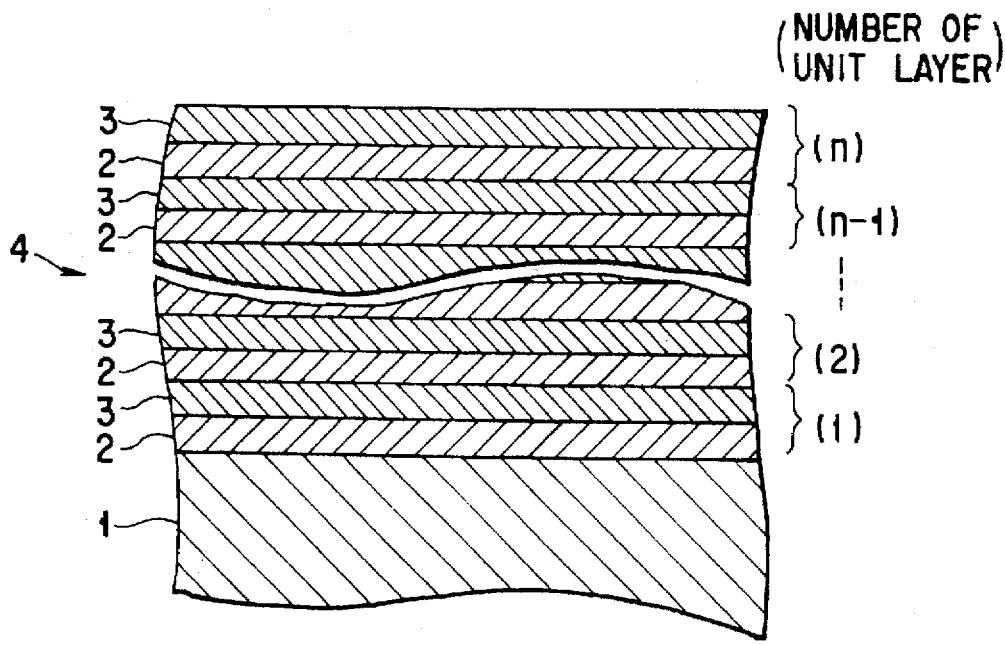
F I G. 1
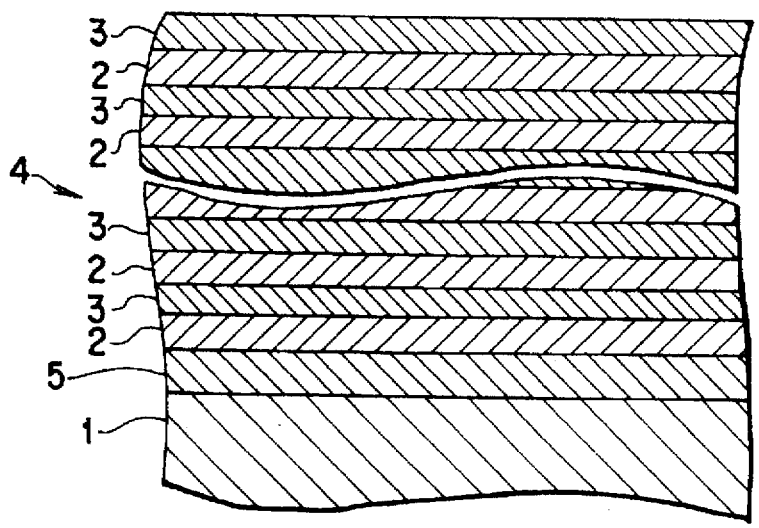
F I G. 2

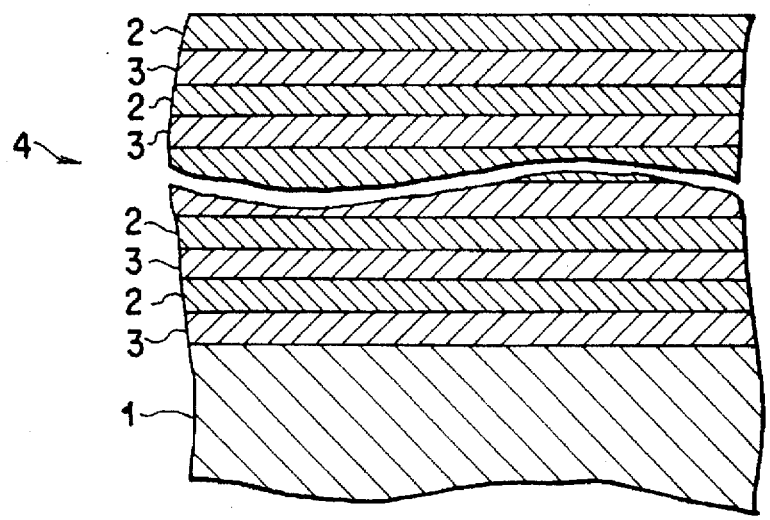
F I G. 3
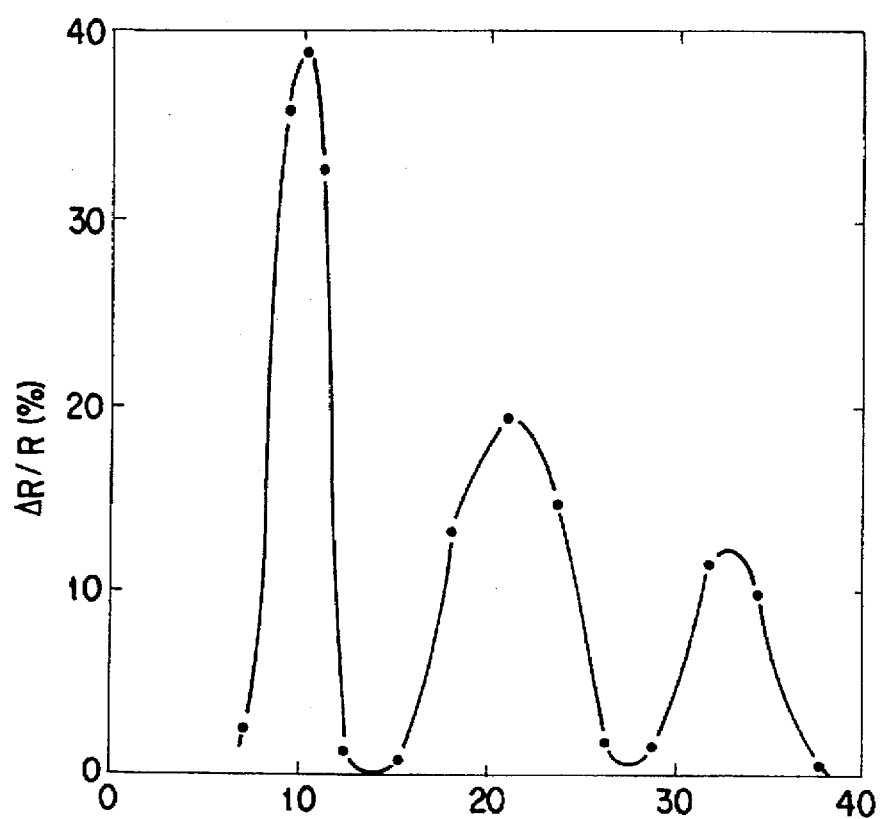
F I G. 4

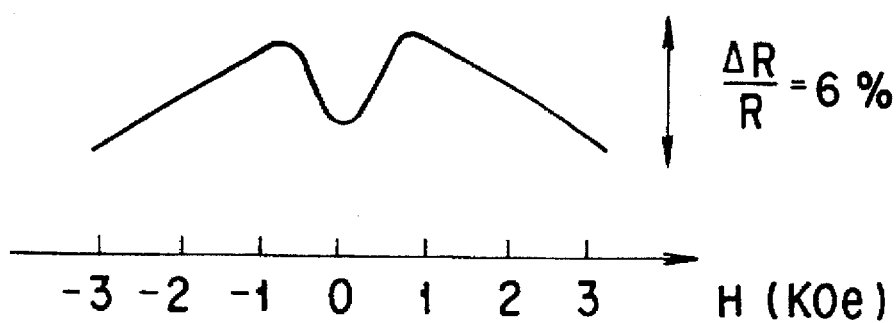
F I G. 6
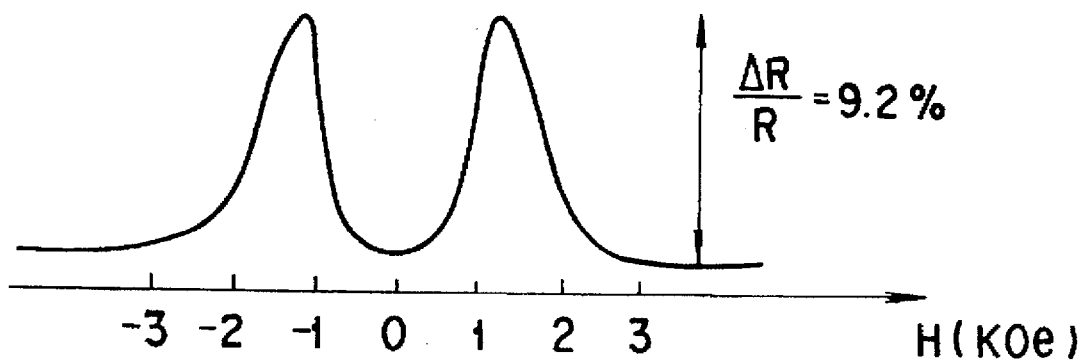
F I G. 7

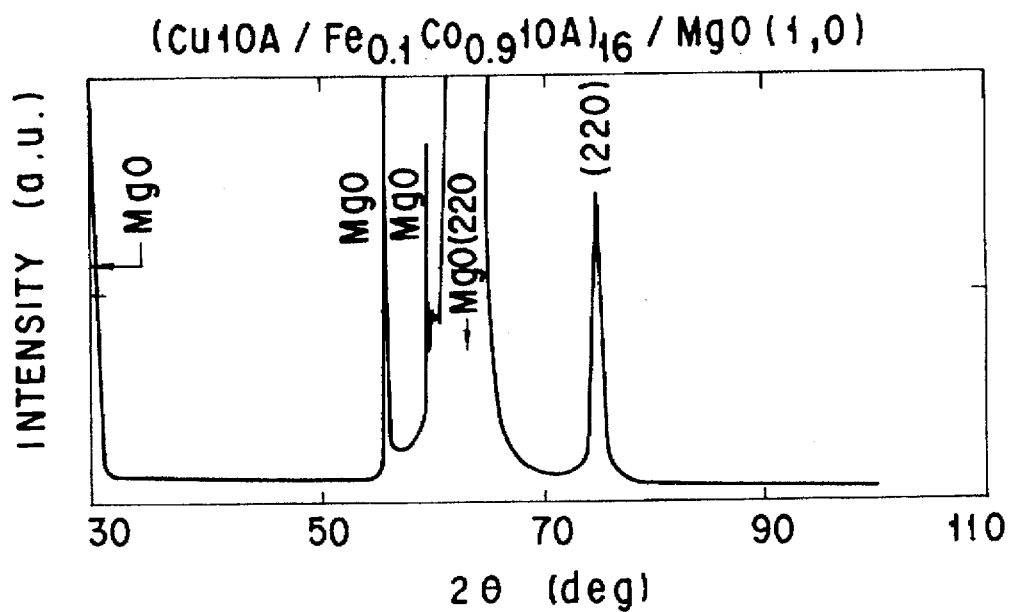
F I G. 10
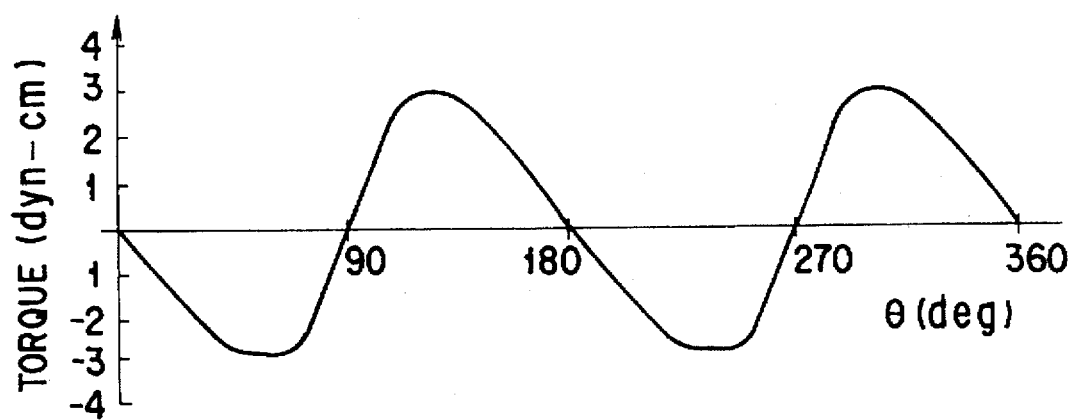
F I G. 11

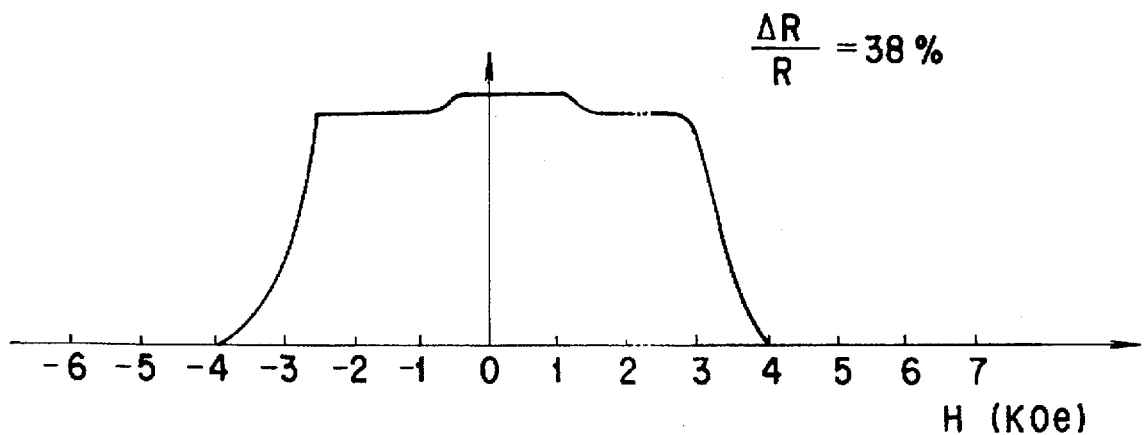
F I G. 12
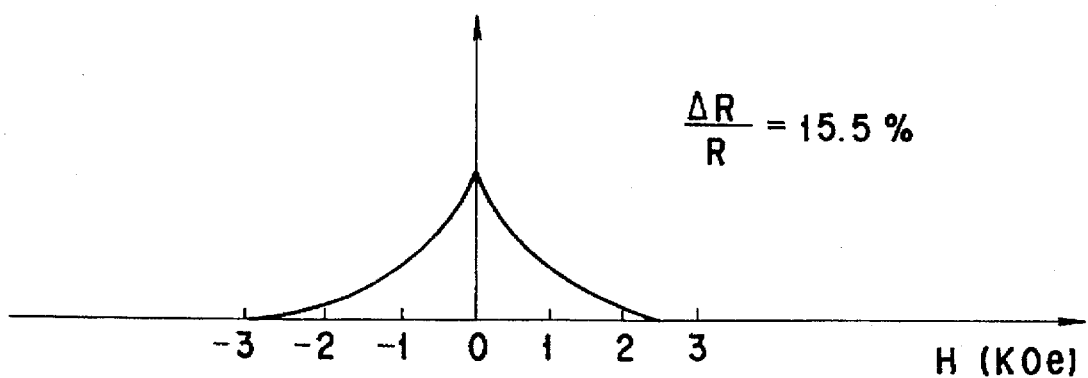
F I G. 13

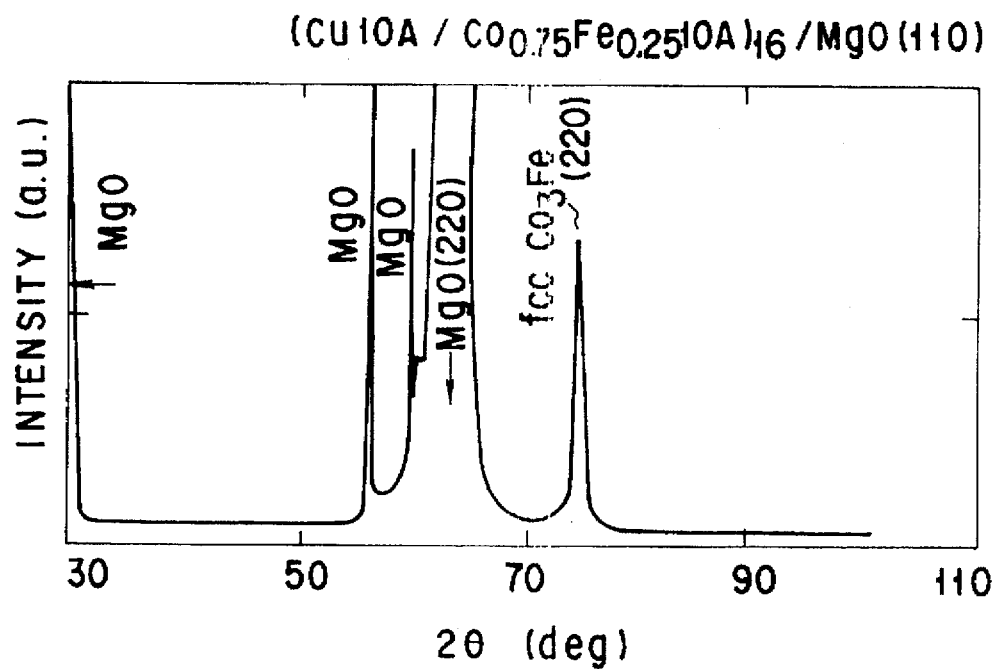
F I G. 20
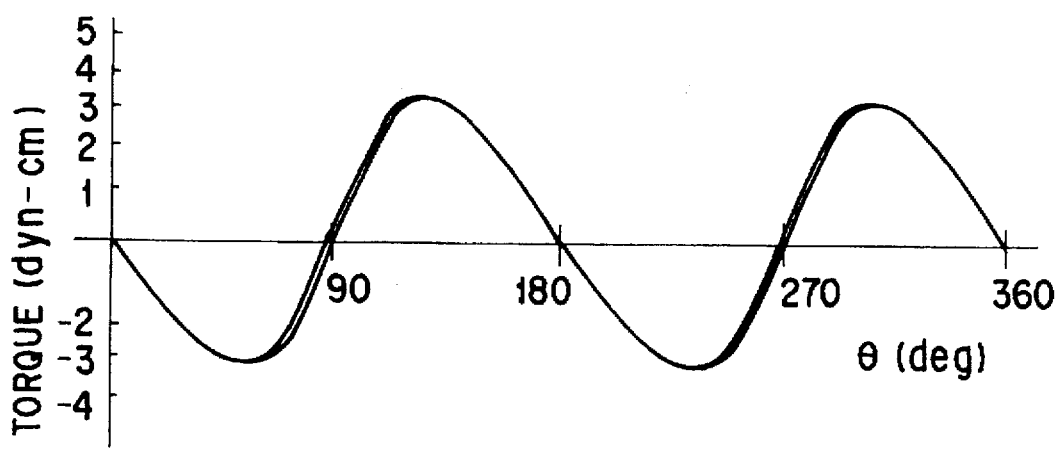
F I G. 21

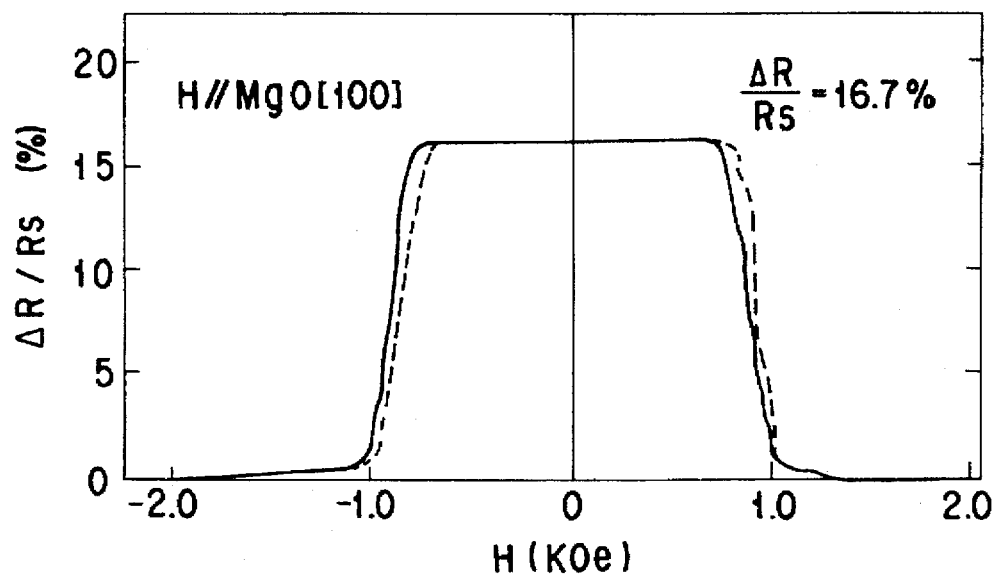
F I G. 30
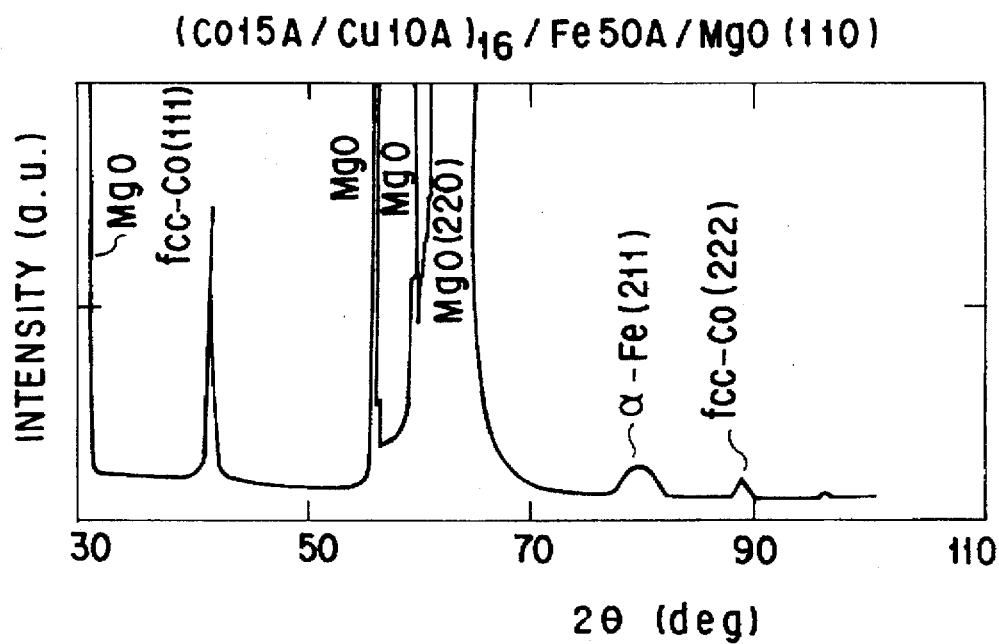
F I G. 31

MAGNETORESISTANCE EFFECT ELEMENT

This application is a Continuation Ser. No. 07/913,644, filed on Jul. 14,1992, now abandoned.

Background of the Invention

1. Field of the Invention

The present invention relates to a magnetoresistance effect element formed by using a multilayer of ultra-thin layers or a so-called artificial lattice film.

2. Description of the Related Art

The magnetoresistance effect is an effect of varied resistance of an object caused by the variation in the intensity of the magnetic field applied to it. Magnetoresistance effect elements that utilize this effect find a variety of applications including those for magnetic field sensors and magnetic heads because of the high sensitivity to magnetic fields and the ability to produce a relatively large output of such elements. While Permalloy thin film is widely used for magnetoresistance effect elements, the magnetoresistance ratio of a Permalloy film ($\Delta R/R_s$: where $\Delta R$ is the electric resistance change between zero magnetic field and saturated magnetic field; Rs is saturation resistivity) is as low as 2 or 3% and, therefore, does not show a satisfactory sensitivity to changes in the magnetic field required for a magnetoresistance effect element.

On the other hand, as a new magnetoresistance effect element, a multilayer formed of alternately stacked magnetic and nonmagnetic layers each having a thickness of several to tens of Angstroms or a so-called artificial lattice film attracts attentions in recent years. Known types of the artificial lattice film includes $(Fe/Cr)_n$ (Phys. Rev. Lett. vol. 61(21) (19988)2472), $(Permalloy/Cu/Co/Cu)_n$ (J. Phys. Soc. Jap. 5 vol. 59(9) (1990) 3061), and $(Co/Cu)_n$ (J. Mag. Mag. Mat. 94,(1991)L1; Phys. Rev. Lett. 66(1991) 2152).

The artificial lattice film disclosed in the prior art exemplified above exhibits such a large magnetoresistance ratio as scores of % and, thus, is suitable for use in this sense in a magnetoresistance effect element. However, the saturation field $H_S$ of the known artificial lattice film is as high as several kOe to scores of kOe in contrast to only several Oe for Permalloy. It follows that, where the known artificial lattice film is used in a magnetic sensor or a magnetic head designed to detect a low magnetic field, the magnetic sensor or head fails to exhibit a sufficient sensitivity.

When used in a magnetic sensor or a magnetic head, it is desirable for the artificial lattice film to exhibit a large magnetoresistance ratio under a low magnetic field. To this end, the saturation field $H_S$ of the artificial lattice film is required to be diminished. However, an artificial lattice film meeting the particular requirements has not yet been developed.

SUMMARY OF THE INVENTION

The present invention, which has been achieved in view of the situation described above, is intended to provide a magnetoresistance effect element which exhibits a large magnetoresistance effect, which is low in its saturation field, and which permits producing a large magnetoresistance ratio under a low magnetic field.

According to an aspect of the present invention, 10 there is provided a magnetoresistance effect element, comprising a substrate having at least a surface region formed of a single crystal of cubic crystal system, the (110) plane of said single crystal constituting a main surface of the substrate, and a multilayer formed on the main surface of the substrate, said multilayer being prepared by stacking magnetic metal layers and nonmagnetic metal layers such that the multilayer produces a magnetoresistance effect.

According to another aspect of the present invention, there is provided a magnetoresistance element comprising a multilayer prepared by stacking magnetic layers of cubic system and nonmagnetic layers, said magnetic layer being distorted such that uniaxial easy axis of magnetization is formed within a plane.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view showing a magnetoresistance effect element according to one embodiment of the present invention;

FIG. 2 is a cross sectional view showing a magnetoresistance effect element according to another embodiment of the present invention;

FIG. 3 is a cross sectional view showing a magnetoresistance effect element according to still another embodiment of the present invention;

FIG. 4 is a graph showing the relationship between the thickness of the nonmagnetic layer and the magnetoresistance ratio;

FIG. 6 is a graph showing a magnetoresistance curve of an element prepared in Example 1 described herein later;

FIG. 7 is a graph showing a magnetoresistance curve of an element prepared in Example 2 described herein later;

FIG. 10 shows an X-ray diffraction pattern of the element prepared in Example 5 described herein later;

FIG. 11 shows a torque curve of the element prepared in Example 5 described herein later;

FIG. 12 is a graph showing a magnetoresistance curve of an element prepared in Example 5 described herein later;

FIG. 13 is a graph showing a magnetoresistance curve of an element prepared as a control case relative to Example 5 described herein later;

FIG. 20 shows an X-ray diffraction pattern of an element prepared in Example 7 described herein later;

FIG. 21 shows a torque curve of an element prepared in Example 7 described herein later;

FIG. 30 shows a magnetoresistance curve of an element prepared in Example 9 described herein later;

FIG. 31 shows an X-ray diffraction pattern of an element prepared in Example 10 described herein later;

DETAILED DESCRIPTION OF THE PREFERRED EMBODIMENTS

Figure 5:
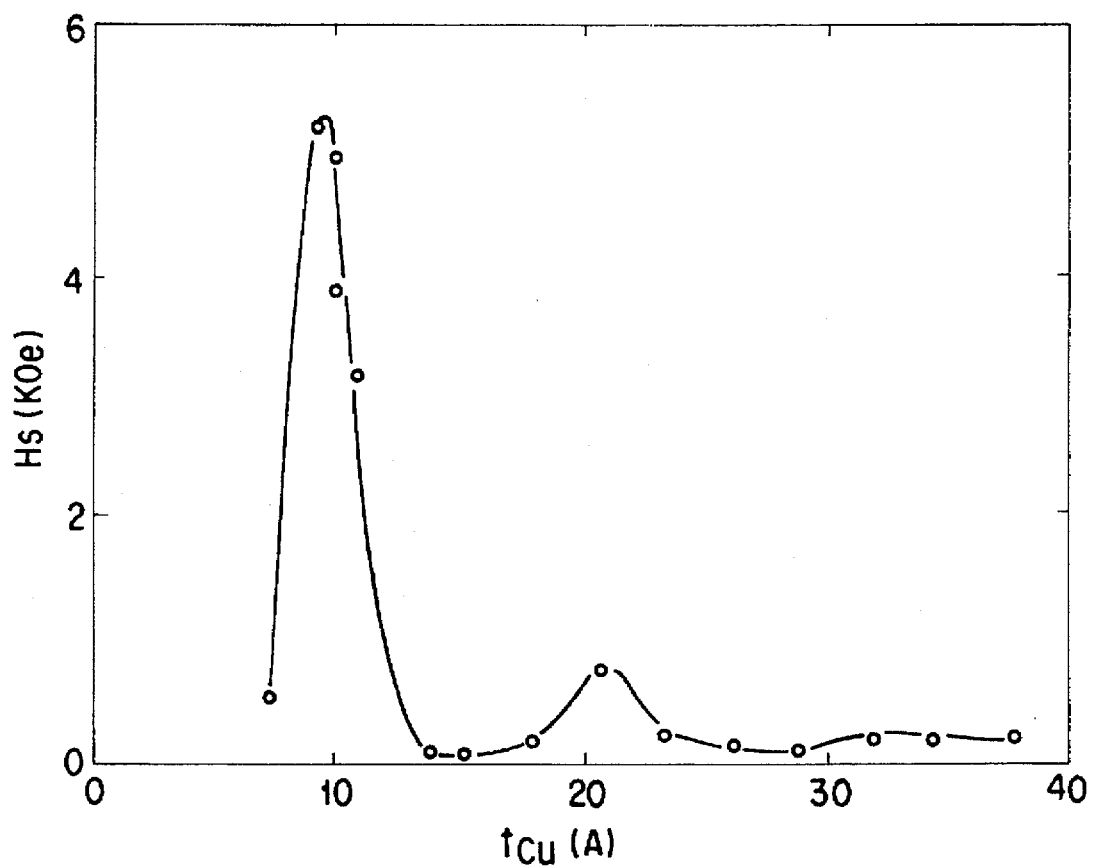
FIG. 5 is a graph showing the relationship between the thickness of the nonmagnetic layer and the saturation field.

The magnetoresistance effect element according to a first embodiment of the present invention comprises a substrate having at least a surface portion formed of a single crystal of cubic crystal system, the (110) plane of said single crystal constituting a main surface of the substrate, and a multilayer formed on the main surface of the substrate, said multilayer being prepared by stacking magnetic metal layers and nonmagnetic metal layers such that the prepared multilayer exhibits a magnetoresistance effect.

In short, the first embodiment of the present invention is featured in that the multilayer of the particular construction is formed on the (110) plane of a single crystal of cubic system. It is possible to markedly lower the saturation magnetic field of the multilayer by forming on the (110) plane of a single crystal of cubic system the multilayer prepared by stacking magnetic layers and nonmagnetic layers such that the multilayer produces a magnetoresistance effect. It is considered reasonable to understand that, if the particular multilayer is formed on a crystal face having an anisotropy such as the (110) plane of cubic crystal system, a magnetic anisotropy is imparted to the magnetic layers included in the multilayer so as to form an easy axis of magnetization, with the result that the saturation magnetic field is lowered.

As shown in, for example, FIG. 1, the magnetoresistance effect element according to the first embodiment of the present invention comprises a substrate 1 and a multilayer 4 formed on the substrate 1. The multilayer 4 consists of n-pairs of a nonmagnetic layer 2 and a magnetic layer 3 stacked one upon the other. In other words, the pair of the nonmagnetic layer 2 and the magnetic layer 3 are stacked n-times to form the multilayer 4.

At least the surface portion of the substrate 1 is formed of a single crystal of cubic crystal system such that the (110) plane of the single crystal constitutes the main surface of the substrate 1. Of course, the entire region of the substrate 1 may be formed of the particular single crystal. Alternatively, the particular single crystal may be positioned on the upper surface of another member so as to constitute the substrate 1. The substances of cubic system used in the present invention include, for example, Cr, Si, Cu, Fe, Co, Ni and an alloy thereof, $CaF_2$, LiF, MgO and GaAs. The multilayer is formed on the (110) plane of these cubic crystals in the present invention.

In the first embodiment, in order to increase the magnetoresistance ratio, a buffer layer 5 formed of, for example, iron may be interposed between the surface of the substrate 1 and the multilayer 4, as shown in FIG. 2. The particular effect is produced where the buffer layer 5 has a thickness of at least 3 Å.

The materials used for forming the magnetic layer 3 include, for example, transition metals such as Fe, Co and Ni as well as alloys containing these transition metals. It is desirable for the adjacent magnetic layers having a nonmagnetic metal layer interposed therebetween to be antiferromagnetically coupled with each other under the condition that substantially no magnetic field is applied to the multilayer. The antiferromagnetic coupling noted above indicates that the adjacent magnetic layers having a nonmagnetic metal layer interposed therebetween are opposite to each other in the direction of the magnetic moment. The particular coupling permits increasing the magnetoresistance ratio. It is certainly desirable for the adjacent magnetic layers to be antiferromagnetically coupled with each other. However, it is desirable for the coupling force to be small. If the antiferromagnetic coupling force is small, the saturation field $H_S$ can be diminished so as to make the magnetoresistance effect element adapted for use in, for example, a magnetic head. It should be noted that the saturation field $H_S$ should desirably be lowered in order to enlarge the magnetoresistance ratio $\Delta R/R$ under a low magnetic field.

The materials of the nonmagnetic layer 2 are not particularly restricted in the present invention as far as the multilayer 4 is enabled to exhibit a magnetoresistance effect. For example, the nonmagnetic layer 2 may be formed of Cu, Cr, Au, Ag, Ru. These metals can be used singly or in the form of an alloy. Where a Cu-Au alloy is used for forming the nonmagnetic layer, it is possible to diminish the antiferromagnetic coupling force noted above. Where the magnetic layer 3 is formed of a Co-based material, it is desirable to use a Cu, Ag or Au-based material for forming the nonmagnetic layer 2. It is most desirable to use copper for forming the nonmagnetic layer.

For forming the multilayer 4, the nonmagnetic layer 2 may be formed first, as shown in FIG. 1. Alternatively, it is desirable to form the magnetic layer 3 first in direct contact with the substrate 1, as shown in FIG. 3. In this case, the magnetoresistance effect can be enhanced, and induction of a uniaxial magnetic anisotropy tends to be facilitated.

In order to obtain a sufficiently large magnetoresistance ratio $\Delta R/R$, it is desirable for the thickness $t_M$ of the magnetic layer to fall within a range of between 2 Å and 100 Å (2 Å$\leq t \leq$100 Å) and for the thickness $t_N$ of the nonmagnetic layer to fall within a range of between 2 Å and 100 Å (2 Å$\leq t_N \leq$100 Å). More desirably, the value of $t_M$ and $t_N$ noted above should be: 7 Å$\leq t_M \leq$90 Å and 9 Å$\leq t_N \leq$90 Å.

FIG. 4 shows the relationship between the thickness of the nonmagnetic layer and the magnetoresistance ratio. Since the magnetoresistance ratio is widely changed by the change in the thickness of the nonmagnetic layer as shown in FIG. 4, it is desirable to determine the thickness $t_N$ of the nonmagnetic layer such that a large magnetoresistance ratio can be obtained within the range of the thickness noted above. The saturation field is also dependent on the thickness of the nonmagnetic layer, as shown in FIG. 5. What should be noted is that the thickness of the nonmagnetic layer exhibiting the peak value of the saturation magnetic field overlaps with the thickness exhibiting the peak value of the magnetoresistance ratio, as apparent from comparison between FIG. 4 and 5. It follows that it is desirable to determine the thickness of the nonmagnetic layer in view of the balance between the magnetoresistance ratio and the saturation field depending on the use of the magnetoresistance effect element. The data plotted in FIGS. 4 and 5 were obtained from a multilayer prepared by stacking 16 times a pair of a magnetic layer of $Fe_{0.1}Co_{0.9}$ having a thickness of 10 Å and a nonmagnetic layer of Cu having a different thickness. These data were obtained by the measurement at room temperature.

The number n of stacking times falls in general between 2 and 100. The number n should desirably be large in view of the magnetoresistance effect. If the number n is unduly large, however, the magnetoresistance effect is saturated, making it necessary to determine the number n of stacking times in view of the saturation noted above.

The magnetoresistance effect element according to a second embodiment of the present invention comprises a multilayer prepared by stacking magnetic layers of cubic crystal system and nonmagnetic layers such that the multilayer exhibits a magnetoresistance effect, said magnetic layer being distorted such that a uniaxial easy axis of magnetization may be formed within a plane. The particular construction of the second embodiment permits increasing the magnetoresistance effect and also permits diminishing the saturation field.

The magnetoresistance effect element of the second embodiment may be constructed as shown in FIG. 1 like the element of the first embodiment described above. It is also possible in the second embodiment to interpose the buffer layer 5 formed of a soft magnetic material such as iron between the substrate 1 and the multilayer 4 as shown in FIG. 2, as in the first embodiment. Further, the magnetic layer 3 may be formed first in direct contact with the substrate 1 in the second embodiment as shown in FIG. 3, as in the first embodiment. As in the first embodiment, the particular construction shown in FIG. 3 permits increasing the magnetoresistance effect and also permits facilitating the induction of a uniaxial magnetic anisotropy, as in the first embodiment.

The substrate 1 is not particularly restricted in the second embodiment. However, in order to facilitate the induction of a magnetic anisotropy, it is desirable for at least the surface region of the substrate to be formed of a single crystal of cubic crystal system such that the (110) plane of the single crystal constitutes the main surface of the substrate. The materials used for forming the substrate include, for example, Cr, Si, Cu, Fe, Co, Ni and an alloy thereof, LiF, $CaF_2$, MgO and GaAs.

As described previously, the magnetic layer 3 has a crystal structure of cubic crystal system and is distorted such that a uniaxial easy axis of magnetization is formed in a plane. The materials used for forming the magnetic layer 3 include, for example, transition metals such as Fe, Co and Ni as well as alloys thereof. It is also possible to use an alloy containing the transition metal exemplified above. To be more specific, it is desirable to use an alloy represented by $Co_{1-x}Fe_x$ in which x is less than 0.5 and an alloy represented by $Co_{1-x}Fe_xNi_y$ in which the sum of x and y is less than 0.5. Most desirably, the value of x in the CoFe alloy noted above should be 0.3 or less, and the value of (x+y) in the CoFeNi alloy noted above should be 0.3 or less.

In the magnetoresistance effect element of the second embodiment described above, it is considered reasonable to understand that the distortion of the magnetic layer 3 permits introduction of a large magnetic anisotropy into the plane so as to form an easy axis of magnetization, leading to reduction in the saturation field.

In order to facilitate the induction of a large magnetic anisotropy, it is desirable to form the magnetic layer 3 in direct contact with the substrate. It is also possible to introduce an induced magnetic anisotropy by applying a magnetic field to the multi-layer during formation of the magnetic layer and by annealing the multilayer in the magnetic field. In this case, it is possible to use an amorphous material such as glass or resin for forming the substrate 1.

In the second embodiment, it is desirable for the adjacent magnetic layers having a nonmagnetic layer interposed therebetween to be antiferromagnetically coupled with each other under the condition that substantially no magnetic field is applied to the multilayer, as in the first embodiment described previously. Also, the second embodiment may be equal to the first embodiment in the materials of the nonmagnetic layer 2. Likewise, the second embodiment may desirably be equal to the first embodiment in the range of the thickness of the magnetic layer and in the range of the thickness of the nonmagnetic layer.

In each of the first and second embodiments of the present invention, the multilayer 4 can be formed without difficulty by means of, for example, RF magnetron sputtering method, ion beam sputtering (IBS) method, vapor deposition method, molecular beam epitaxy (MBE) method or ultra-vacuum sputtering method.

Incidentally, the layers constituting the multi-layer need not be equal to each other in the composition and the thickness.

The Examples given below are believed to further clarify the technical idea of the present invention.

EXAMPLE 1

In this Example, a MgO (110) single crystal substrate was used as a substrate 1, and a multilayer consisting of Co magnetic layers and Cu nonmagnetic layers was formed on the (110) plane of the substrate by means of an ion beam sputtering method.

Specifically, a MgO (110) single crystal substrate was set in a chamber in the first step, followed by evacuating the chamber to a vacuum of $5 \times 10^{-7}$ Torr. Then, an argon gas was introduced into the chamber up to a pressure of $1 \times 10^{-4}$ Torr. Under this condition, a sputtering was carried out under an accelerating voltage of 500 v and a beam current of 30 mA. Used in the sputtering treatment were a Co target and a Cu target, and the sputtering operation was performed such that a Co layer (magnetic layer) having a thickness of 10 Å and a Cu layer (nonmagnetic layer) having a thickness of 10 Å were alternately formed one upon the other, as shown in FIG. 1. Fifteen pairs of the magnetic and nonmagnetic layers are stacked one upon the other so as to obtain a magnetoresistance effect element, which is hereinafter referred to as (Co10 Å/Cu10 Å)$_{15}$/MgO (110).

The magnetoresistance effect of the magnetoresistance effect element (Co10 Å/Cu10 Å)$_{15}$/MgO (110) thus prepared relative to an external magnetic field was measured by a four points method, which is widely used in this technical method. FIG. 6 is a graph showing the magnetoresistance curve thus measured. Then, a magneto-resistance ratio ΔR/R denoting the magnitude of the magnetoresistance effect was determined from the graph of FIG. 6. It has been found that the magnetoresistance ratio ΔR/R was as large as 6% under a magnetic field as weak as about 1 kOe. It has also been found that the magnetoresistance effect exhibits a unique change relative to the external magnetic field. On the other hand, a saturation field was as strong as about 6 kOe when it comes to an element prepared by forming a multi layer equal to that in Example 1 on a SiO$_2$ substrate.

As described above, it has been confirmed that an element prepared by alternately stacking several times a nonmagnetic layer and a magnetic layer on a substrate formed of a MgO (110) single crystal exhibits a satisfactory magnetoresistance ratio under a relatively weak magnetic field and, thus, is suitable for use in a magnetoresistance effect element.

EXAMPLE 2

In this Example, a MgO (110) single crystal substrate was used as a substrate 1, and an iron layer acting as a buffer layer was formed on the (110) plane of the substrate, followed by forming a multilayer consisting of Co magnetic layers and Cu nonmagnetic layers on the Fe buffer layer by means of an ion beam sputtering method. The conditions for the ion beam sputtering operation were equal to those in Example 1.

Specifically, an iron layer having a thickness of 50 Å was formed in the first step on the MgO (110) single crystal substrate, followed by alternately forming a Co layer (magnetic layer) having a thickness of 10 Å and a Cu layer (nonmagnetic layer) having a thickness of 10 Å one upon the other, as shown in FIG. 2. Fifteen pairs of the magnetic and nonmagnetic layers are stacked one upon the other so as to obtain a magnetoresistance effect element, which is hereinafter referred to as (Co10 Å/Cu10 Å)$_{15}$/Fe /MgO (110).

The magnetoresistance effect of the magnetoresistance effect element (Co10 Å/Cu10 Å)$_{15}$/Fe /MgO (110) thus prepared relative to an external magnetic field was measured by a four points method, as in Example 1. FIG. 7 is a graph showing the magnetoresistance curve thus measured. Then, a magnetoresistance ratio ΔR/R denoting the magnitude of the magnetoresistance effect was determined from the graph of FIG. 7. It has been found that the magnetoresistance ratio ΔR/R was as large as 9.2% under a magnetic field as weak as about 1 kOe. On the other hand, a saturation field was as strong as about 6 kOe when it comes to an element prepared by forming a multilayer equal to that in Example 2 on a SiO$_2$ substrate.

As described above, it has been confirmed that an element prepared by forming an iron layer acting as a buffer layer on a substrate formed of a MgO (110) single crystal, followed by alternately stacking several times a nonmagnetic layer and a magnetic layer on the iron buffer layer exhibits a satisfactory magnetoresistance ratio under a relatively weak magnetic field and, thus, is suitable for use in a magnetoresistance effect element.

EXAMPLE 3

In this Example, a MgO (110) single crystal substrate was used as a substrate 1, and an iron layer acting as a buffer layer was formed on the (110) plane of the substrate, followed by forming a multilayer consisting of Cu nonmagnetic layers and magnetic layers formed of an alloy Fe$_{0.1}$Co$_{0.9}$ on the Fe buffer layer by means of an ion beam sputtering method. The conditions for the ion beam sputtering operation were equal to those in Example 1.

Specifically, an iron layer having a thickness of 50 Å was formed in the first step on the MgO (110) single crystal substrate, followed by alternately forming a Fe$_{0.1}$Co$_{0.9}$ layer (magnetic layer) having a thickness of 10 Å and a Cu layer (nonmagnetic layer) having a thickness of 10 Å one upon the other, as shown in FIG. 2. Fifteen pairs of the magnetic and nonmagnetic layers are stacked one upon the other so as to obtain a magnetoresistance effect element, which is hereinafter referred to as (Fe$_{0.1}$Co$_{0.9}$10 Å/Cu10 Å)$_{15}$/Fe/MgO (110).

Figure 8:
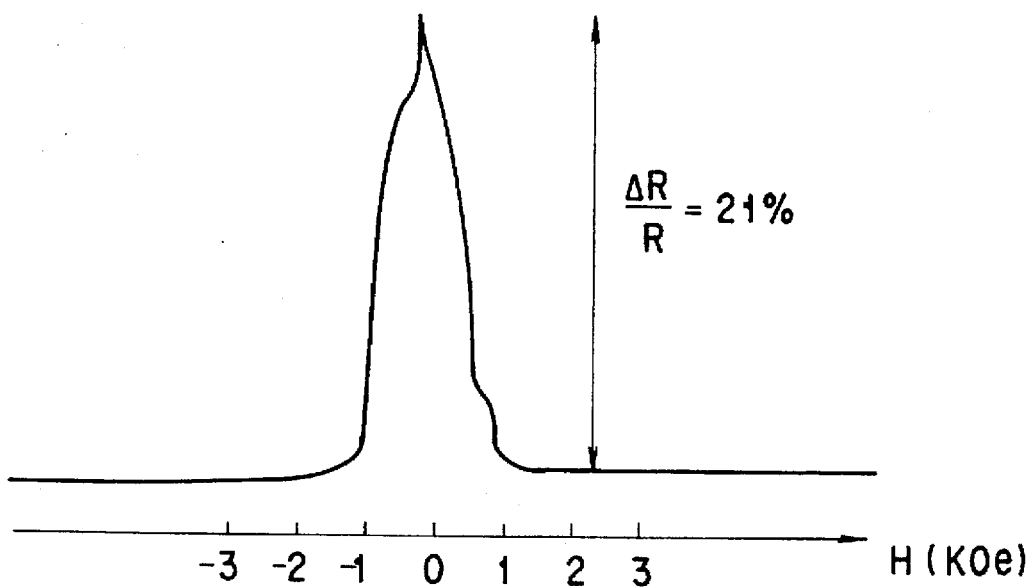
FIG. 8 is a graph showing a magnetoresistance curve of an element prepared in Example 3 described herein later.

The magnetoresistance effect of the magnetoresistance effect element thus prepared relative to an external magnetic field was measured by a four points method, as in Example 1. FIG. 8 is a graph showing the magnetoresistance curve thus measured. Then, a magnetoresistance ratio ΔR/R denoting the magnitude of the magnetoresistance effect was determined from the graph of FIG. 8. It has been found that the magnetoresistance ratio ΔR/R was as large as 21% under a magnetic field as weak as about 1 kOe or less. On the other hand, a saturation field was as strong as about 6.5 kOe when it comes to an element prepared by forming a multilayer equal to that in Example 3 on a SiO$_2$ substrate.

As described above, it has been confirmed that an element prepared by forming an iron layer acting as a buffer layer on a substrate formed of a MgO (110) single crystal, followed by alternately stacking several times a nonmagnetic layer and a magnetic layer on the iron buffer layer exhibits a satisfactory magnetoresistance ratio under a relatively weak magnetic field and, thus, is suitable for use in a magnetoresistance effect element.

EXAMPLES 4

In this Example, a MgO (110) single crystal substrate was used as a substrate 1, and an iron layer acting as a buffer layer was formed on the (110) plane of the substrate, followed by forming a multilayer consisting of Cu nonmagnetic layers and magnetic layers formed of an alloy Ni$_{0.8}$Fe$_{0.1}$Co$_{0.1}$ on the Fe buffer layer by means of an ion beam sputtering method. The conditions for the ion beam sputtering operation were equal to those in Example 1.

Specifically, an iron layer having a thickness of 50 Å was formed in the first step on the MgO (110) single crystal substrate, followed by alternately forming a Ni$_{0.8}$Fe$_{0.1}$Co$_{0.1}$ layer (magnetic layer) having a thickness of 15 Å and a Cu layer (nonmagnetic layer) having a thickness of 10 Å one upon the other, as shown in FIG. 2. Fifteen pairs of the magnetic and nonmagnetic layers are stacked one upon the other so as to obtain a magneto-resistance effect element, which is hereinafter referred to as $Ni_{0.8}Fe_{0.1}Co_{0.1}$ 50 Å/Cu10 Å)$_{15}$/Fe/MgO (110).

Figure 9:
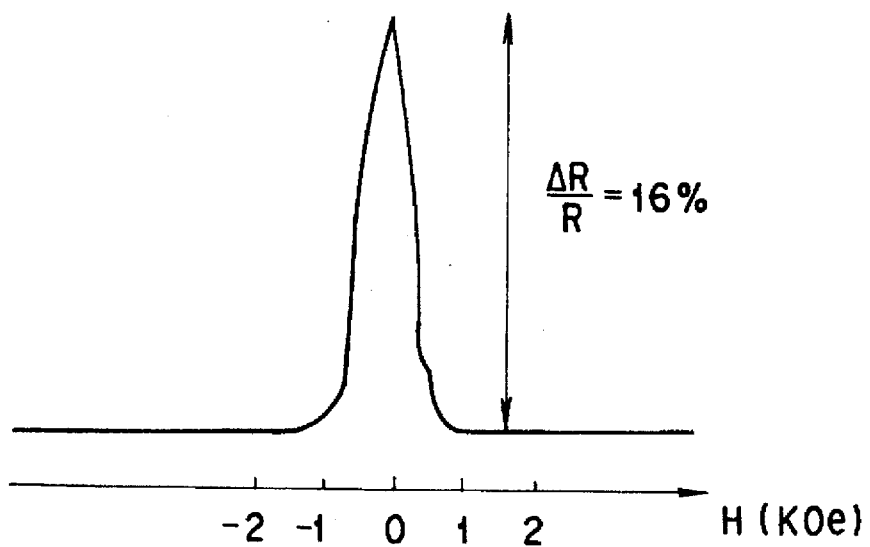
FIG. 9 is a graph showing a magnetoresistance curve of an element prepared in Example 4 described herein later.

The magnetoresistance effect of the magneto-resistance effect element thus prepared relative to an external magnetic field was measured by a four points method, as in Example 1. FIG. 9 is a graph showing the magnetoresistance curve thus measured. Then, a magneto-resistance ratio $\Delta R/R$ denoting the magnitude of the magnetoresistance effect was determined from the graph of FIG. 9. It has been found that the magnetoresistance ratio $\Delta R/R$ was as large as 16% under a magnetic field as weak as about 1 kOe or less. On the other hand, a saturation magnetic field was as strong as about 4 kOe when it comes to an element prepared by forming a multi-layer equal to that in Example 4 on a $SiO_2$ substrate.

As described above, it has been confirmed that an element prepared by forming an iron layer acting as a buffer layer on a substrate formed of a MgO (110) single crystal, followed by alternately stacking several times a nonmagnetic layer and a magnetic layer on the iron buffer layer exhibits a satisfactory magneto-resistance ratio under a relatively weak magnetic field and, thus, is suitable for use in a magnetoresistance effect element.

EXAMPLE 5

In this Example, a MgO (110) single crystal substrate was used as a substrate 1, and a multilayer consisting of $Fe_{0.1}Co_{0.9}$ magnetic layers and Cu nonmagnetic layers was formed on the (110) plane of the substrate by means of an ion beam sputtering method.

Specifically, a MgO (110) single crystal substrate was set in a chamber in the first step, followed by evacuating the chamber to a vacuum of $5 \times 10^{-7}$ Torr. Then, an argon gas was introduced into the chamber up to a pressure of $1 \times 10^{-4}$ Torr. Under this condition, a sputtering was carried out under an accelerating voltage of 700V and a beam current of 30 mA. Used in the sputtering operation were a $Fe_{0.1}Co_{0.9}$ alloy target and a Cu target, and the sputtering operation was performed such that a $Fe_{0.1}Co_{0.9}$ layer (magnetic layer) having a thickness of 10 Å and a Cu layer (nonmagnetic layer) having a thickness of 10 Å were alternately formed one upon the other. In this sputtering operation, the lowermost magnetic layer was formed in direct contact with the substrate, as shown in FIG. 3. Sixteen pairs of the magnetic and nonmagnetic layers are stacked one upon the other so as to obtain a magnetoresistance effect element, which is hereinafter referred to as (Cu10 Å/$Fe_{0.1}Co_{0.9}$10 Å)$_{16}$/MgO (110).

FIG. 10 shows the X-ray diffraction pattern of the multilayer included in the magnetoresistance effect element (Cu10 Å/$Fe_{0.1}Co_{0.9}$10 Å)$_{16}$/MgO (110) thus prepared. As apparent from FIG. 10, recognized was the presence of a peak denoting the presence of (220) plane of face centered cubic crystal system of the magnetic layer $Fe_{0.1}Co_{0.9}$. FIG. 11 shows a torque curve of the multi-layer included in the element noted above. As seen from FIG. 11, the torque curve was indicating that a uniaxial anisotropy was induced within a plane. Similarly, a marked dependence on direction was also recognized in the measurement of the magnetoresistance effect. These clearly indicate that the magnetic layer of a distorted cubic crystal system permits generating a large magnetic anisotropy within a plane so as to form an easy axis of magnetization.

FIG. 12 shows the magnetoresistance effect in the direction of easy axis of magnetization. It is seen from FIG. 12 that the saturation field $H_S$ was 4 kOe. On the other hand, the saturation field was as strong as about 7 kOe, when it comes to an element prepared by forming a multilayer similar to that in Example 5 on a $SiO_2$ substrate. In other words, the saturation field was much lowered in Example 5. Also, the magneto-resistance ratio was found to be as high as 38% in Example 5.

FIG. 12 also shows that a change in resistance begins to take place when the magnetic field is increased to exceed about 3 kOe, and the change is drastic. It follows that it is possible to achieve measurement of a magnetic field with a very high accuracy by using the particular region noted above.

Incidentally, FIG. 13 shows the magnetoresistance effect of a magnetoresistance effect element in which the multilayer was formed by stacking the magnetic and nonmagnetic layers in the order opposite to that in Example 5. In this case, the magnetoresistance ratio was found to be only 15.5% in contrast to 38% for Example 5 described above.

EXAMPLE 6

In this Example, a MgO (110) single crystal substrate was used as a substrate 1, and a multilayer consisting of Co magnetic layers each having a thickness of 10 Å and Cu nonmagnetic layers each having a thickness of 10 Å was formed on the (110) plane of the substrate by means of an ion beam sputtering method under the conditions equal to those in Example 5. In forming the multilayer, a Co layer was formed first in direct contact with the substrate, followed by forming a Cu layer on the Co layer so as to form a pair of Co and Cu layers. The pair of the magnetic and nonmagnetic layers was stacked 16 times so as to form a magnetoresistance effect element (Cu10 Å/Co10 Å)16/MgO (110).

Figure 14:
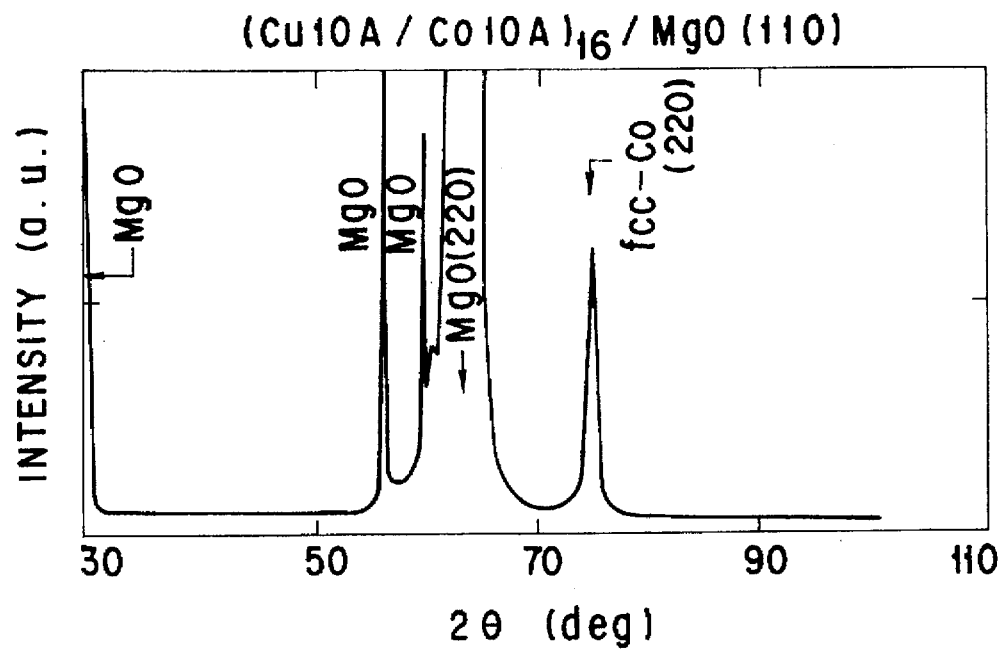
FIG. 14 shows an X-ray diffraction pattern of the element prepared in Example 6 described herein later.
Figure 15:
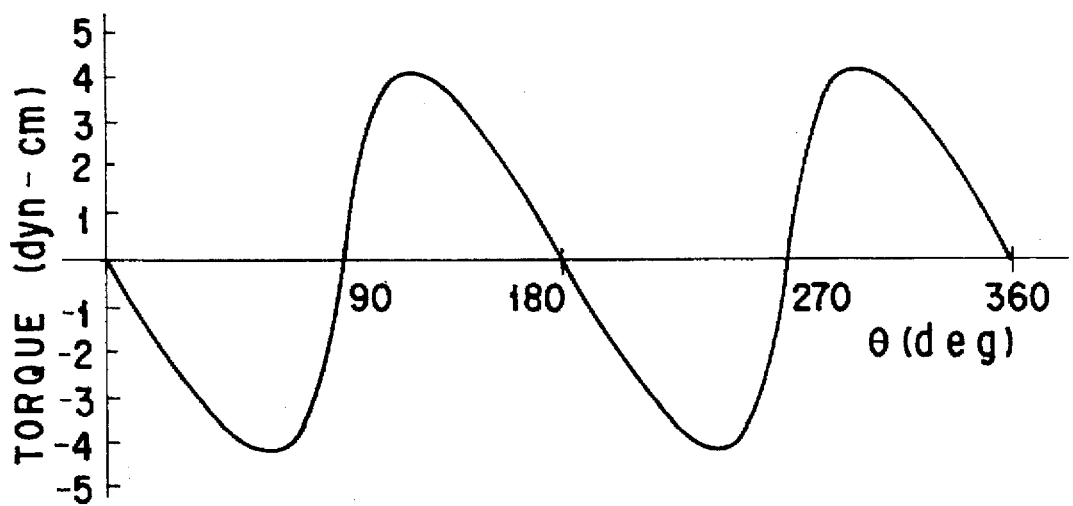
FIG. 15 shows a torque curve of the element prepared in Example 6 described herein later.

FIG. 14 shows the X-ray diffraction pattern of the multilayer included in the magnetoresistance effect element thus prepared. As apparent from FIG. 14, recognized was the presence of a peak denoting the presence of (220) plane of face centered cubic crystal system of the Co magnetic layer. FIG. 15 shows a torque curve of the multilayer included in the element noted above. As seen from FIG. 15, the torque curve was indicating that a uniaxial anisotropy was induced within a plane.

Figure 16:
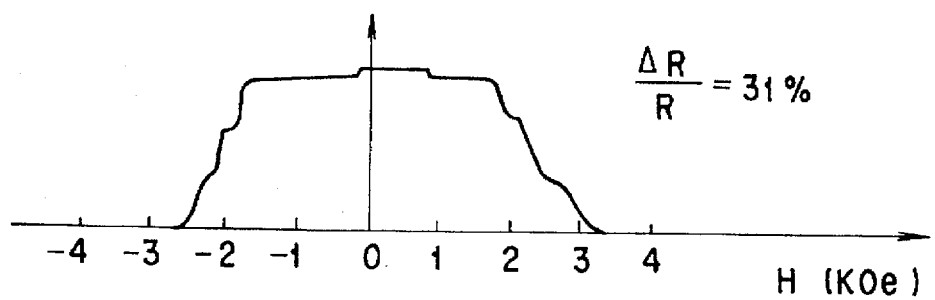
FIG. 16 is a graph showing a magnetoresistance curve of an element prepared in Example 6 described herein later.

FIG. 16 shows the magnetoresistance effect in the direction of easy axis of magnetization. It is seen from FIG. 16 that the magnetoresistance ratio was as high as 31%.

Figure 17:
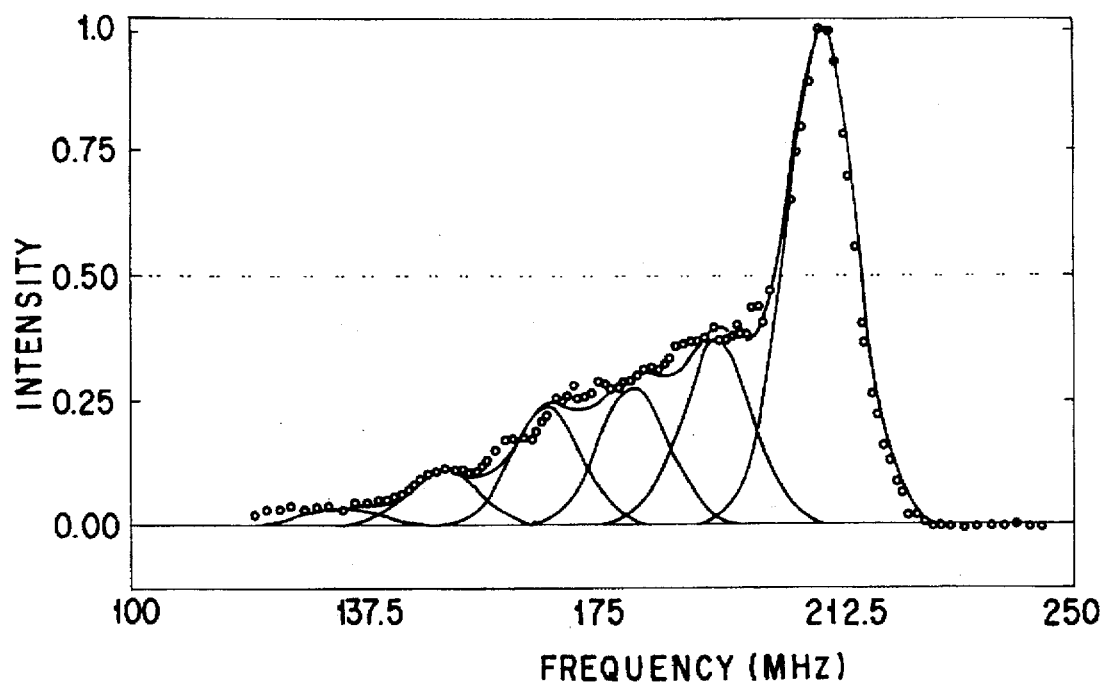
FIG. 17 shows an NMR spin-echo intensity as a function of frequency of an artificial lattice film of $(Co10 Å/Cu10 Å)_{100}$ structure.

FIG. 17 shows an NMR spin-echo intensity as a function of frequency of an artificial lattice film (Co10 Å/Cu10 Å)$_{100}$. The measurement was performed at 4.2k so as to measure the spin echo spectrum intensity within a frequency range of between 120 and 240 MHz. The spectrum intensity shown in the drawing was corrected by a square of frequency relative to the frequency used. It is seen from FIG. 17 that a signal of the site in which 12 nearest neighbor sites of Co are all surrounded by a Co nucleus has a peak at 210 MHz, indicating that a shoulder does not reside on the side of the higher frequency. This leads to a conclusion in respect of the structure of the Co layer included in the artificial lattice film that the face centered cubic system is distorted. FIG. 17 also suggests that Co of hexgonal system is not included in the artificial lattice structure because a shoulder does not reside on the side of the higher frequency, as pointed out above.

Further, FIG. 17 shows that the resonance frequency of the Co layer was 210 MHz. On the other hand, the Co resonance frequency of bulk is 217 MHz. In other words, the resonance frequency of the Co layer is shifted from the bulk frequency toward a lower frequency side by 7 MHz.

Under the circumstances, the degree of distortion can be calculated by using formula (1) given below, i.e., the formula taken from (R. V. Johes et al,: Bull. Am. Phys. Soc. 5,175 (1960), D. H. Anderson et al,: J. Appl. Phys. 35, 3043 (1964), J. F. Janak: Phys. Rev. B21, 2206 (1979)):

$$\Delta B_{hf}/B_{hf} = -1.16 \Delta V/V \quad (1)$$

where, $B_{hf}$ is hyperfine field, and V is volume.

The distortion degree $\Delta V/V$ of the Co layer included in the element of Example 6 was calculated by using formula (1) given above, with the result that the distortion degree was about 2.8%. Further, the uniaxial magnetic anisotropy Ku induced in this case was determined from the torque curve, with the result that the value of Ku was as large as $5 \times 10^6$ erg/cc. In short, it has been confirmed that a very large uniaxial magnetic anisotropy can be induced by such a small distortion as about 2.8%.

Figure 18:
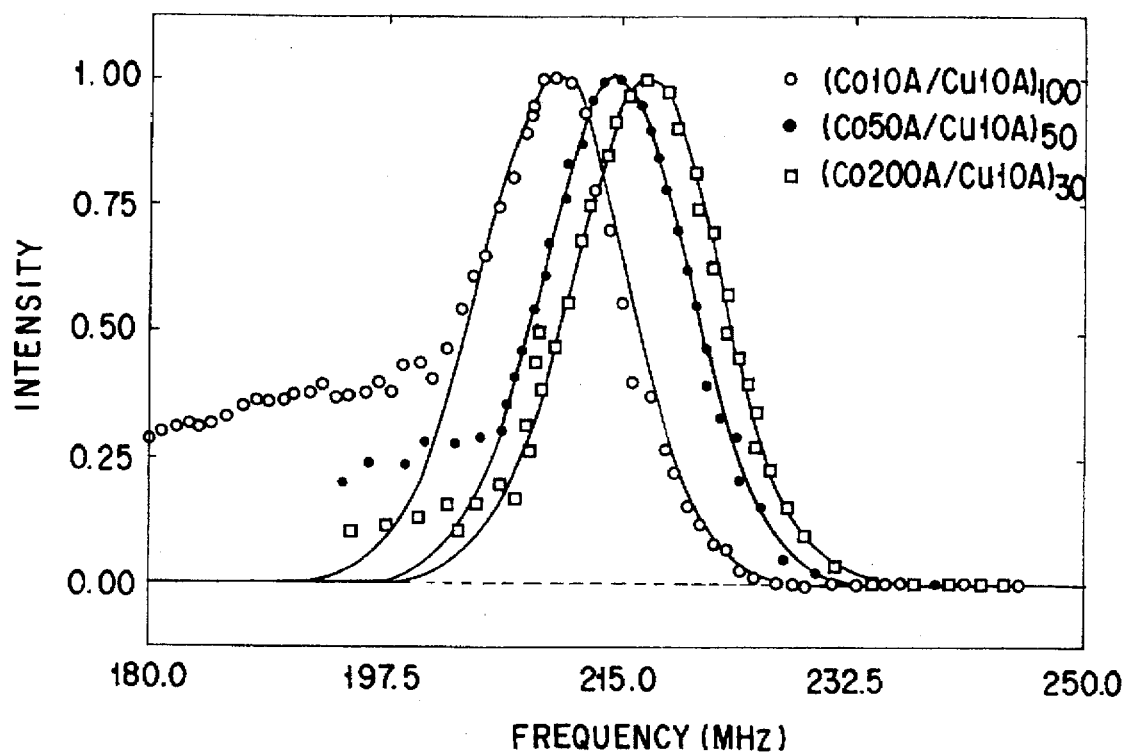
FIG. 18 shows an NMR spin-echo intensity as a function of frequency in the case of changing the thickness of the magnetic layer.

FIG. 18 shows NMR frequency spectra in the case of changing the thickness of the magnetic layer. It is seen from the drawing that the shifting of the resonance frequency tends to be diminished with increase in the thickness of the magnetic layer. It has been confirmed that distortion of the magnetic layer is induced where the thickness of the magnetic layer is increased to reach about 50 Å, and that the distortion is scarcely induced if the thickness of the magnetic layer is increased to reach 200 Å.

FIG. 16 referred to previously indicates that the saturation field $H_S$ of the magnetoresistance effect element (Cu10 Å/Co10 Å)$_{16}$/MgO (110) is as weak as 3.1 kOe. On the other hand, the saturation magnetic field was about 6.5 kOe when it comes to an element prepared by forming a similar multilayer on a SiO$_2$ substrate. In other words, the saturation field was markedly lowered in the element of Example 6.

Figure 19:
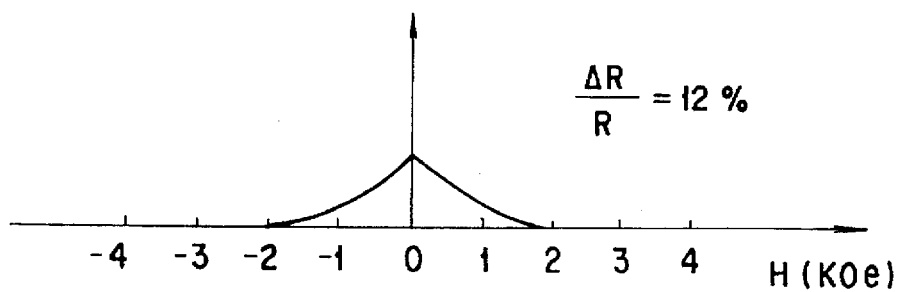
FIG. 19 shows a magnetoresistance curve of an element prepared as a control case relative to Example 6 described herein later.

Incidentally, FIG. 19 shows the magnetoresistance effect of a magnetoresistance effect element in which the multilayer was formed by stacking the magnetic and nonmagnetic layers in the order opposite to that in Example 6. In this case, the magnetoresistance ratio was found to be only 12% in contrast to 31% for Example 6.

EXAMPLE 7

In this Example, a MgO (110) single crystal substrate was used as a substrate 1, and a multilayer consisting of $Co_{0.75}Fe_{0.25}$ magnetic layers each having a thickness of 10 Å and Cu nonmagnetic layers each having a thickness of 10 Å was formed on the (110) plane of the substrate by means of an ion beam sputtering method under the conditions equal to those in Example 5. In forming the multilayer, a $Co_{0.75}Fe_{0.25}$ layer was formed first in direct contact with the substrate, followed by forming a Cu layer on the $Co_{0.75}Fe_{0.25}$ layer so as to form a pair form a pair of $Co_{0.75}Fe_{0.25}$ and Cu layers. The pair of the magnetic and nonmagnetic layers was stacked 16 times so as to form a magnetoresistance effect element (Cu10 Å/10$_{0.75}$Fe$_{0.25}$10 Å)$_{16}$/MgO (110).

Figure 22:
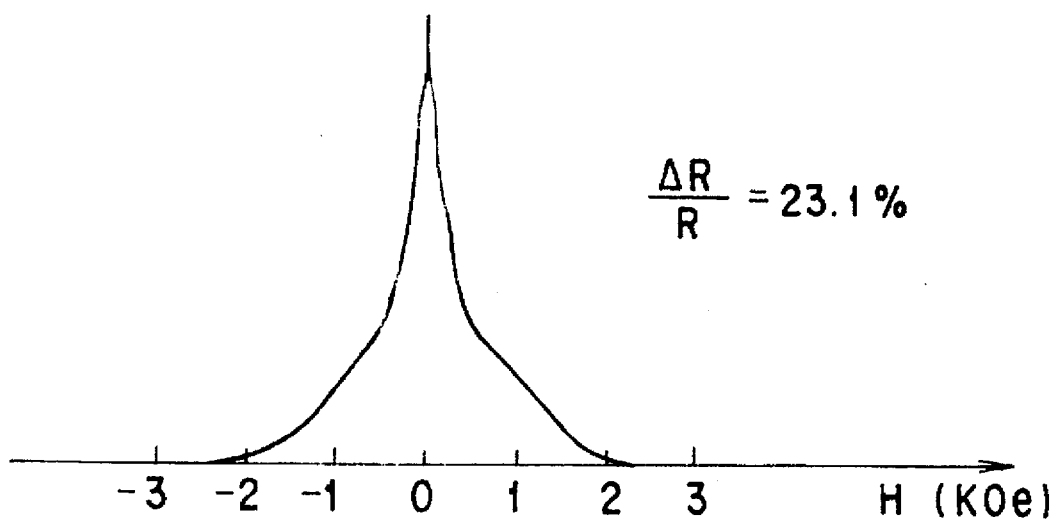
FIG. 22 shows a magnetoresistance curve of an element prepared in Example 7 described herein later.

FIG. 20 shows the X-ray diffraction pattern of the multilayer included in the magnetoresistance effect element thus prepared. As apparent from FIG. 20, recognized was the presence of a peak denoting the presence of (220) plane of face centered cubic system of the $Co_{0.75}Fe_{0.25}$ magnetic layer. FIG. 21 shows a torque curve of the multilayer included in the element noted above. As seen from FIG. 21, the torque curve was indicating that a uniaxial anisotropy was induced within a plane. FIG. 22 shows the magnetoresistance effect in the direction of easy axis of magnetization. It is seen from FIG. 22 that the magnetoresistance ratio was as high as 23.1%. These results indicate that the magnetic layer in which the cubic system is distorted permits generating a large magnetic anisotropy within a plane so as to form an easy axis of magnetization.

FIG. 22 also indicates that the saturation field $H_S$ of the magnetoresistance effect element (Cu10 Å/Co$_{0.75}$Fe$_{0.25}$10 Å)$_{16}$/MgO (110) is weak as 2 kOe. On the other hand, the saturation field was about 7 kOe when it comes to an element prepared by forming a similar multilayer on a SiO$_2$ substrate. In other words, the saturation field was markedly lowered in the element of Example 7.

Figure 23:
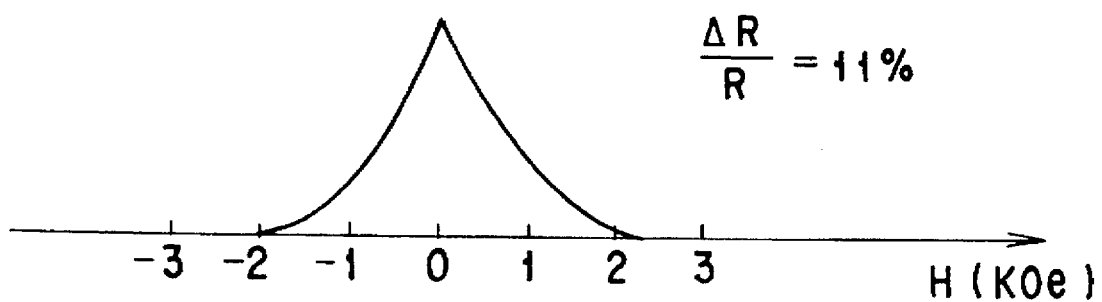
FIG. 23 shows a magnetoresistance curve of an element prepared as a control case relative to Example 7.

Incidentally, FIG. 23 shows the magnetoresistance effect of a magnetoresistance effect element in which the multilayer was formed by stacking the magnetic and nonmagnetic layers in the order opposite to that in Example 7. In this case, the magnetoresistance ratio was found to be only 11% in contrast to 23.1% for Example 7.

EXAMPLE 8

In this Example, a MgO (110) single crystal substrate was used as a substrate 1, and a multilayer consisting of $Co_{0.8}Fe_{0.1}Ni_{0.1}$ magnetic layers each having a thickness of 15 Å and Cu nonmagnetic layers each having a thickness of 10 Å was formed on the (110) plane of the substrate by means of an ion beam sputtering method under the conditions equal to those in Example 5. In forming the multilayer, a $Co_{0.8}Fe_{0.1}Ni_{0.1}$ layer was formed first in direct contact with the substrate, followed by forming a Cu layer on the $Co_{0.8}Fe_{0.1}Ni_{0.1}$ layer so as to form a pair of $Co_{0.8}Fe_{0.1}Ni_{0.1}$ and Cu layers. The pair of the magnetic and nonmagnetic layers was stacked 16 times so as to form a magnetoresistance effect element (Cu10 Å/Co$_{0.8}$Fe$_{0.1}$Ni$_{0.1}$15 Å)$_{16}$/MgO (110)

Figure 24:
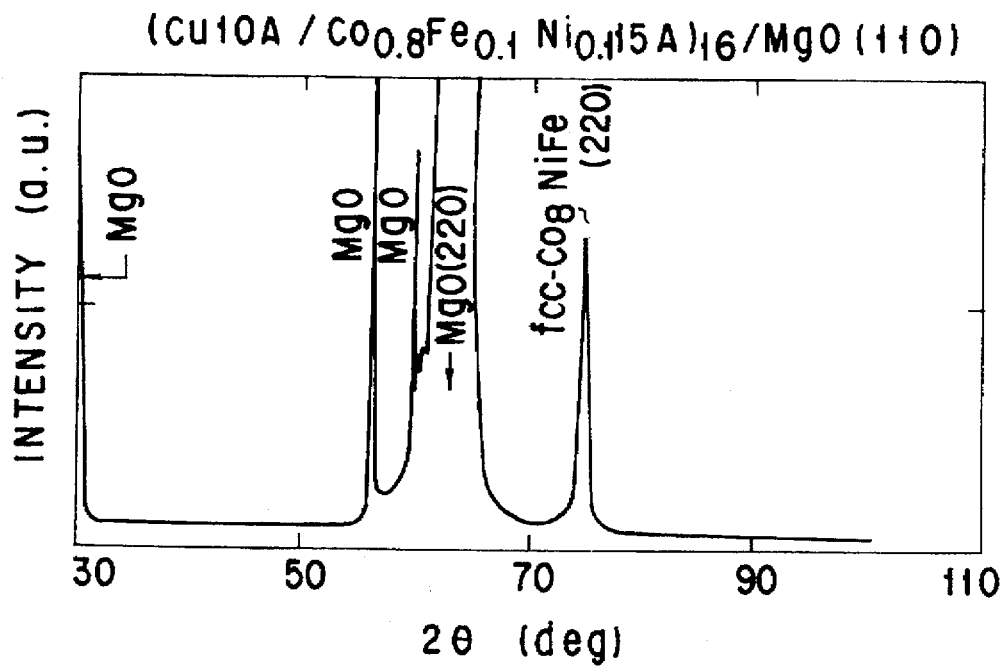
FIG. 24 shows an X-ray diffraction pattern of an element prepared in Example 8 described herein later.
Figure 25:
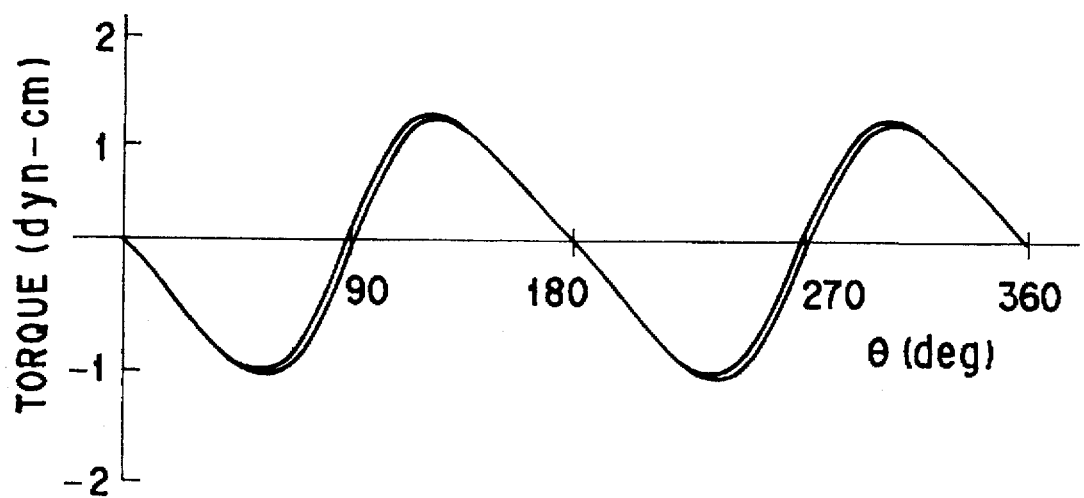
FIG. 25 shows a torque curve of an element prepared in Example 8 described herein later.
Figure 26:
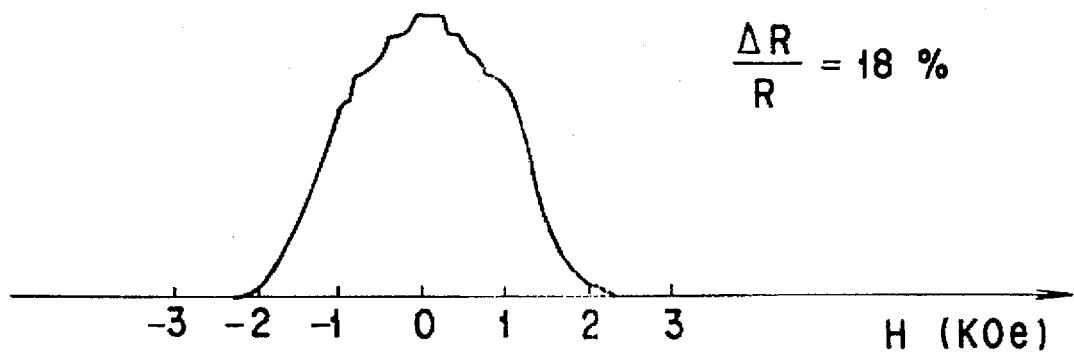
FIG. 26 shows a magnetoresistance curve of an element prepared in Example 8 described herein later.

FIG. 24 shows the X-ray diffraction pattern of the multilayer included in the magnetoresistance effect element thus prepared. As apparent from FIG. 24, recognized was the presence of a peak denoting the presence of (220) plane of face centered cubic system of the $Co_{0.8}Fe_{0.1}Ni_{0.1}$ magnetic layer. FIG. 25 shows a torque curve of the multilayer included in the element noted above. As seen from FIG. 25, the torque curve was indicating that a uniaxial anisotropy was induced within a plane. FIG. 26 shows the magnetoresistance effect in the direction of easy axis of magnetization. It is seen from FIG. 26 that the magnetoresistance ratio was as high as 18%. These results indicate that the magnetic layer in which the cubic system is distorted permits generating a large magnetic anisotropy within a plane so as to form an easy axis of magnetization.

FIG. 26 also indicates that the saturation field $H_S$ of the magnetoresistance effect element (Cu10 Å/Co$_{0.8}$Fe$_{0.1}$Ni$_{0.1}$15 Å)$_{16}$/MgO (110) is weak as 2 kOe. On the other hand, the saturation field was about 4 kOe when it comes to an element prepared by forming a similar multilayer on a SiO$_2$ substrate. In other words, the saturation field was markedly lowered in the element of Example 8.

Figure 27:
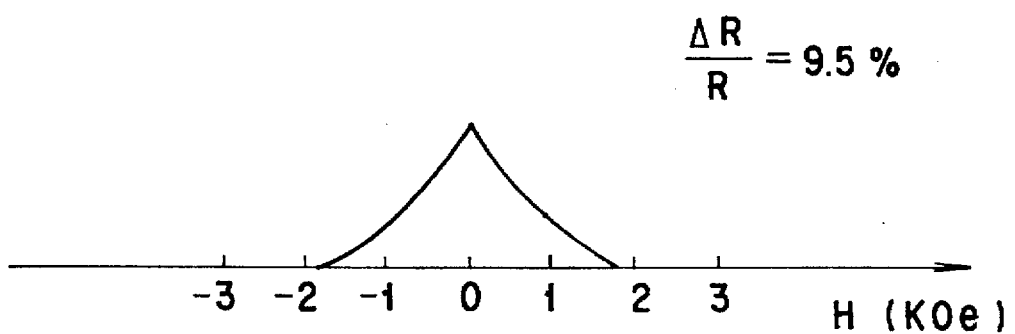
FIG. 27 shows a magnetoresistance curve of an element prepared as a control case relative to Example 8.

Incidentally, FIG. 27 shows the magnetoresistance effect of a magnetoresistance effect element in which the multilayer was formed by stacking the magnetic and nonmagnetic layers in the order opposite to that in Example 8. In this case, the magnetoresistance ratio was found to be only 9.5% in contrast to 18% for Example 8.

EXAMPLE 9

In this Example, a MgO (110) single crystal substrate was used as a substrate 1, and a multilayer consisting of $Ni_{0.8}Fe_{0.2}$ magnetic layers each having a thickness of 15 Å and Cu nonmagnetic layers each having a thickness of 10 Å was formed on the (110) plane of the substrate by means of an ion beam sputtering method under the conditions equal to those in Example 5. In forming the multilayer, a $Ni_{0.8}Fe_{0.2}$ layer was formed first in direct contact with the substrate, followed by forming a Cu layer on the $Ni_{0.8}Fe_{0.2}$ layer so as to form a pair of $Ni_{0.8}Fe_{0.2}$ and Cu layers. The pair of the magnetic and nonmagnetic layers was stacked 16 times so as to form a magnetoresistance effect element (Cu10 Å/$Ni_{0.8}Fe_{0.2}$15 Å)$_{16}$/MgO (110).

Figure 28:
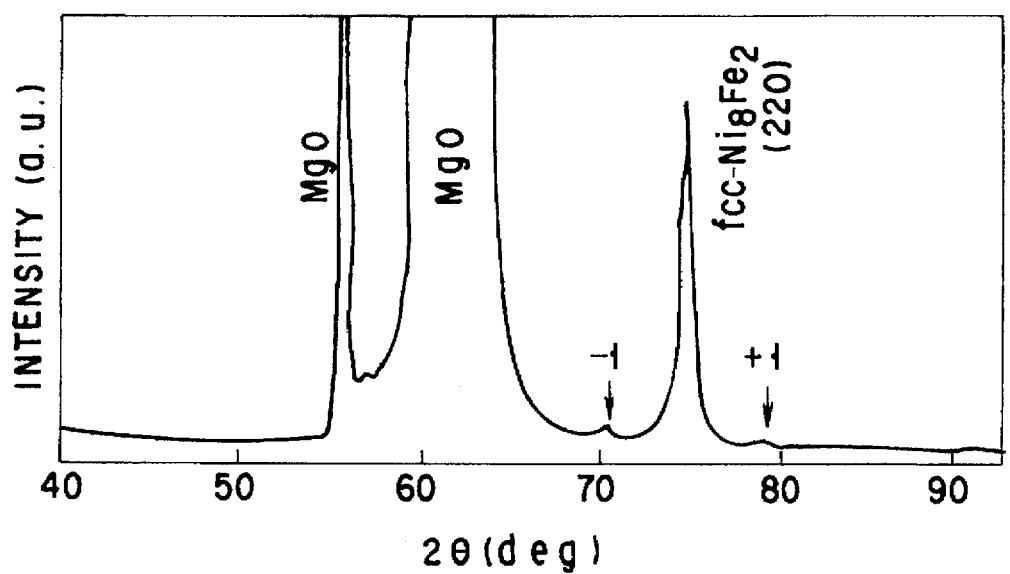
FIG. 28 shows an X-ray diffraction pattern of an element prepared in Example 9 described herein later.
Figure 29:
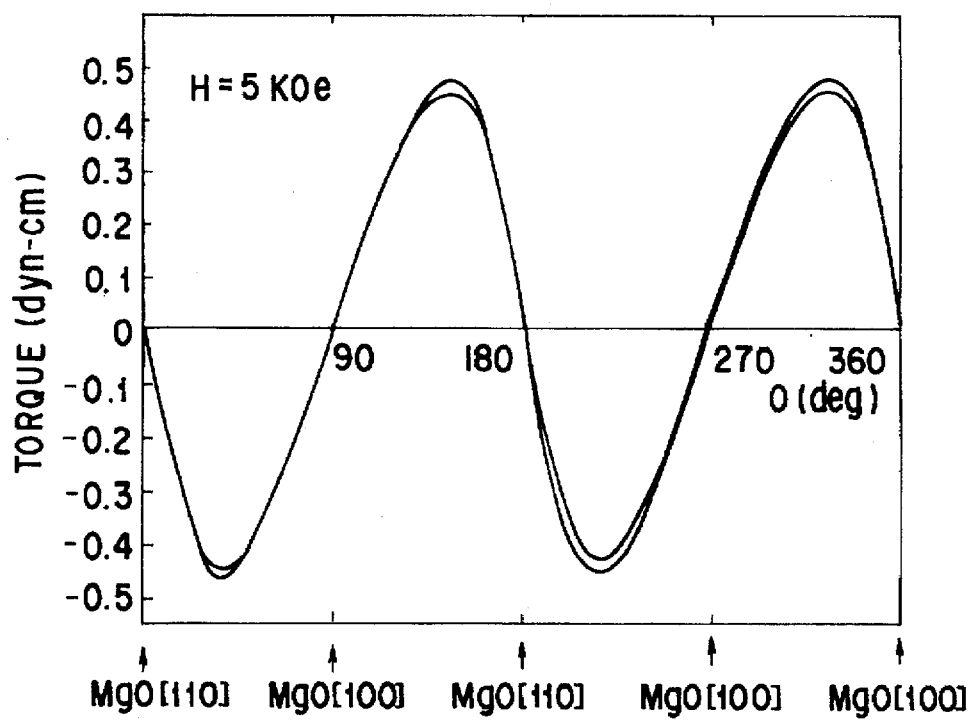
FIG. 29 shows a torque curve of an element prepared in Example 9 described herein later.

FIG. 28 shows the X-ray diffraction pattern of the multilayer included in the magnetoresistance effect element thus prepared. As apparent from FIG. 28, recognized was the presence of a peak denoting the presence of (220) plane of face centered cubic system of the $Ni_{0.8}Fe_{0.2}$ magnetic layer. FIG. 29 shows a torque curve of the multilayer included in the element noted above. As seen from FIG. 29, the torque curve was indicating that a uniaxial anisotropy was induced within a plane. FIG. 30 shows that the magnetoresistance effect is markedly dependent on the direction, and that the magnetoresistance ratio was as high as 16.7%. These results indicate that the magnetic layer in which the cubic system is distorted permits generating a large magnetic anisotropy within a plane so as to form an easy axis of magnetization.

FIG. 30 also indicates that the saturation field $H_S$ of the magnetoresistance effect element (Cu10 Å/$Co_{0.8}Fe_{0.2}$15 Å)$_{16}$/MgO (110) is as weak as 1 kOe. In short, the magnetoresistance effect element of the present invention exhibits a large magnetoresistance ratio with a weak saturation field $H_S$.

EXAMPLE 10

In this Example, a MgO (110) single crystal substrate was used as a substrate 1, and an iron buffer layer 50 Å thick was formed on the (110) plane of the substrate, followed by forming a multilayer consisting of Co magnetic layers each having a thickness of 15 Å and Cu nonmagnetic layers each having a thickness of 10 Å on the iron buffer layer by means of an ion beam sputtering method under the conditions equal to those in Example 5. In forming the multilayer, a Cu layer was formed first in direct contact with the buffer layer, followed by forming a Co layer on the Cu layer so as to form a pair of Cu and Co layers. The pair of the magnetic and nonmagnetic layers was stacked 16 times so as to form a magneto-resistance effect element (Co15 Å/Cu10 Å)$_{16}$Fe50 Å)$_{16}$/MgO (110).

Figure 32:
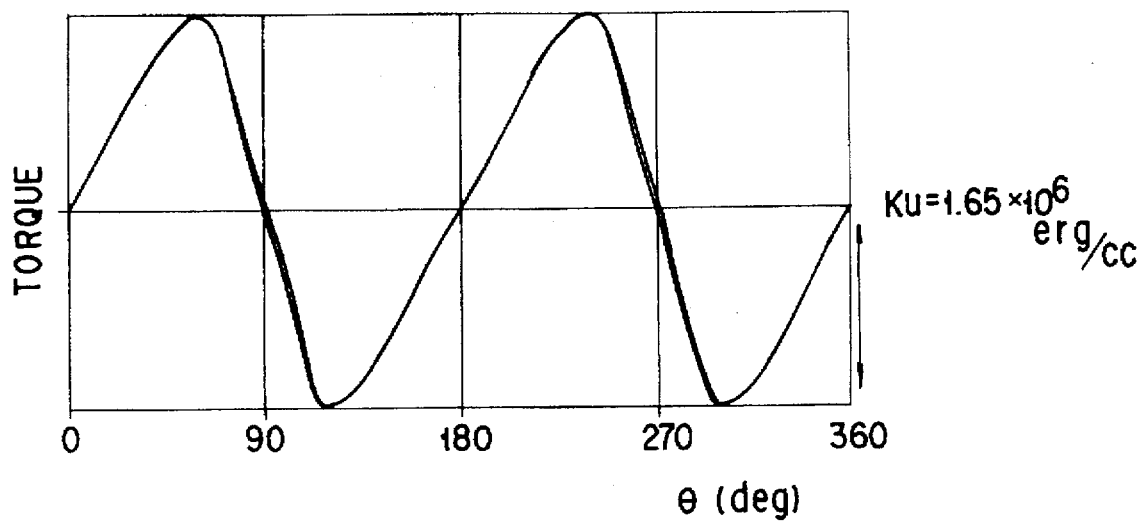
FIG. 32 shows a torque curve of an element prepared in Example 10 described herein later.
Figure 33:
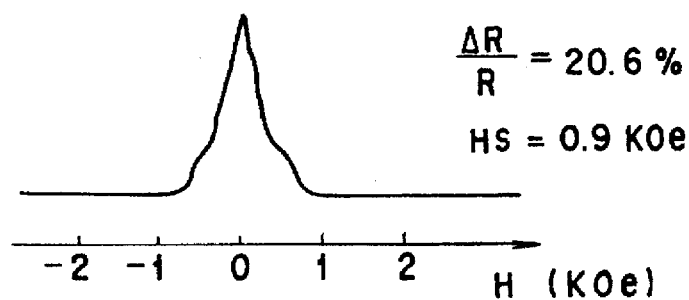
FIG. 33 shows a magnetoresistance curve of an element prepared in Example 10 described herein later.

FIG. 31 shows the X-ray diffraction pattern of the multilayer included in the magnetoresistance effect element thus prepared. As apparent from FIG. 31, recognized was the presence of a peak denoting the presence of (111) plane of face centered cubic system of the Co magnetic layer. Hs of the multilayer is lower when the (111) plane of Co is oliented to in plain than when the (110) plane of Co is obtained to in-plames. FIG. 32 shows a torque curve of the multilayer included in the element noted above. As seen from FIG. 32, the torque curve was indicating that a uniaxial anisotropy was induced within a plane. FIG. 33 shows that the magnetoresistance effect is markedly dependent on the direction, and that the magnetoresistance ratio was as high as 20.6%. These results indicate that the magnetic layer in which the cubic system is distorted permits generating a large magnetic anisotropy within a plane so as to form an easy axis of magnetization.

FIG. 33 also indicates that the saturation field $H_S$ of the magnetoresistance effect element (Co15Å/Cu10Å)$_{16}$/Fe50 Å)/MgO (110) is as weak as 0.9 kOe. In short, the magnetoresistance effect element of the present invention exhibits a large magnetoresistance ratio with a weak saturation field HS.

EXAMPLE 11

In this Example, a MgO (110) single crystal substrate was used as a substrate 1, and a multilayer consisting of $Ni_{0.8}Fe_{0.2}$ (Permalloy) magnetic layers and Cu nonmagnetic layers each having a thickness of 10 Å was formed on the (110) plane of the substrate. In forming the multilayer, a $Ni_{0.8}Fe_{0.2}$ magnetic layer was formed first in direct contact with the substrate, followed by forming a Cu layer on the $Ni_{0.8}Fe_{0.2}$ magnetic layer so as to form a pair of $Ni_{0.8}Fe_{0.2}$ and Cu layers. The pair of the magnetic and nonmagnetic layers was stacked 16 times so as to form a magnetoresistance effect element of the present invention. In this experiment, the thickness of the $Ni_{0.8}Fe_{0.2}$ magnetic layer was changed up to 200 Å.

Figure 34:
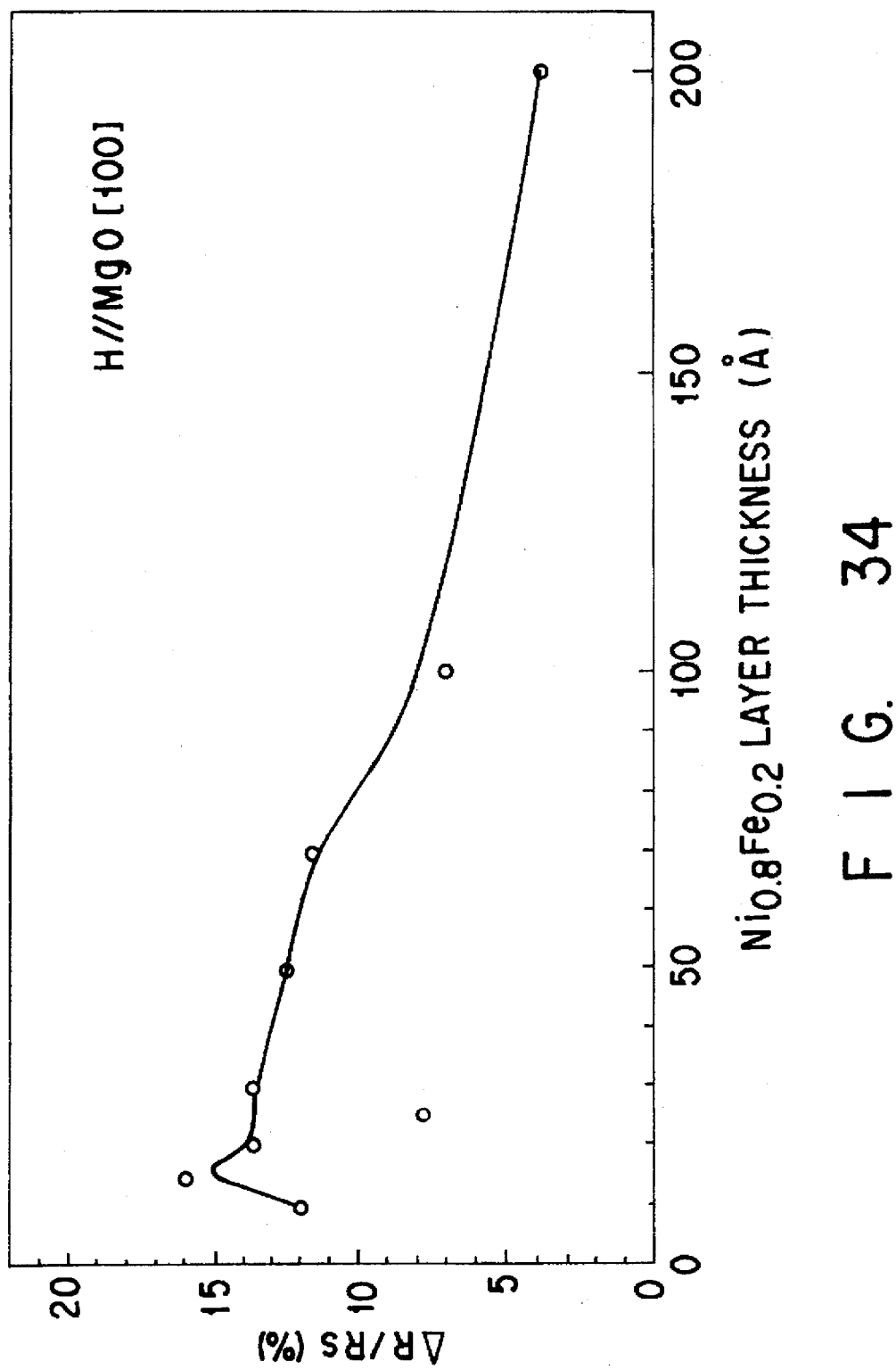
FIG. 34 is a graph showing the relationship between the thickness of a magnetic layer and the magnetoresistance ratio in Example 11 described herein later.
Figure 35:
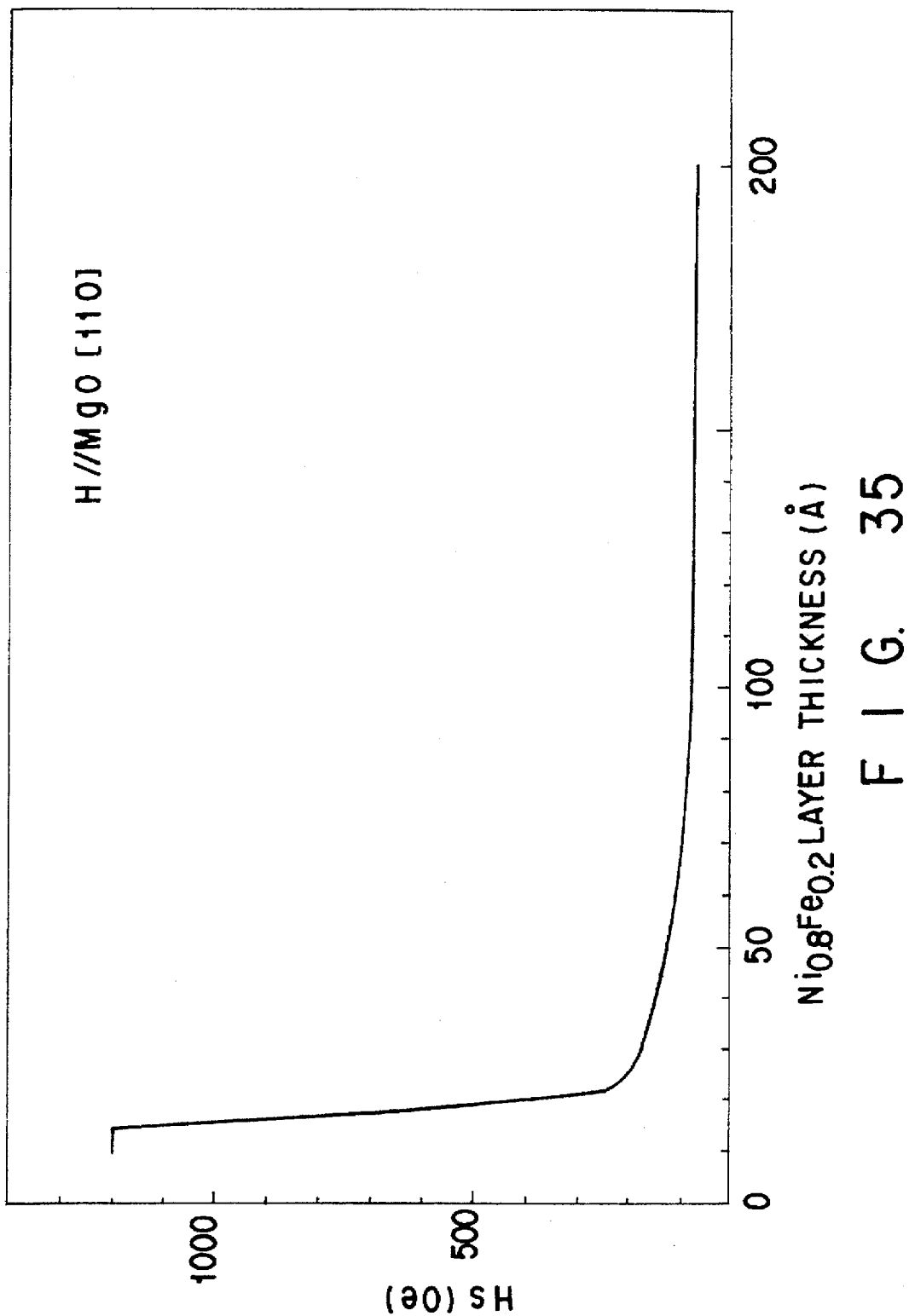
FIG. 35 is a graph showing the relationship between a thickness of a magnetic layer and a saturation field in Example 11 described herein later.

FIG. 34 shows the relationship between the thickness of the $Ni_{0.8}Fe_{0.2}$ magnetic layer and the magnetoresistance ratio. On the other hand, FIG. 35 shows the relationship between the thickness of the $Ni_{0.8}Fe_{0.2}$ magnetic layer and the saturation field. As seen from FIGS. 34 and 35, the magnetoresistance ratio is gradually diminished with increase in the thickness of the $Ni_{0.8}Fe_{0.2}$ magnetic layer. What is more prominent is that the saturation field is markedly lowered with increase in the thickness of the $Ni_{0.8}Fe_{0.2}$ magnetic layer. The reduction in the saturation field is caused mainly by the fact that the Permalloy $Ni_{0.8}Fe_{0.5}$ is made softer by the increase in the $Ni_{0.8}Fe_{0.5}$ magnetic layer.

It should be noted that, if the thickness of the $Ni_{0.8}Fe_{0.5}$ magnetic layer is increased from 100 Å to 200 Å the magnetoresistance ratio is markedly lowered from 7% to 3.8%. However, the saturation field is lowered from 70 Oe to only 60 Oe in this case. It follows that, in the case of using Permalloy for forming the magnetic layer, it is desirable to set the thickness of the magnetic layer at 100 Å or less. More preferably, the thickness of the Permalloy magnetic layer should be 70 Å or less.

Additional advantages and modifications will readily occur to those skilled in the art. Therefore, the invention in its broader aspects is not limited to the specific details, and representative article, shown and described herein. Accordingly, various modifications may be made without departing from the spirit or scope of the general inventive concept as defined by the appended claims and their equivalents.

What is claimed is:

1. A magnetoresistance effect element, comprising:
   a substrate at least a surface portion of which is formed of a single crystal of cubic crystal system, the (110) plane of said single crystal constituting a main surface of said substrate; and
   an artificial lattice film multilayer formed on the main surface of the substrate, said multilayer including magnetic layers and non-magnetic metal layers, said magnetic and non-magnetic layers being stacked in a manner to produce a magnetoresistance effect, and said magnetic layers being distorted such that a uniaxial easy axis of magnetization is formed within a plane, wherein said non-magnetic layers are formed of at least one metal selected from the group consisting of Cu, Au, Ag, and an alloy containing Cu, Au, or Ag, and wherein said magnetic layers are formed of a material selected from the group consisting of Fe, Co, Ni, and an alloy containing Fe, Co or Ni.

2. The magnetoresistance effect element according to claim 1, wherein a buffer layer is interposed between the substrate and the multilayer.

3. The magnetoresistance effect element according to claim 1, wherein the substrate is formed of a material selected from the group consisting of Cr, MgO, GaAs, Si, Cu, Fe, Co, Ni, $CaF_2$ and $LiF_2$.

4. The magnetoresistance effect element according to claim 1, wherein one of said magnetic layers of said multilayer is in direct contact with the substrate.

5. The magnetoresistance effect element according to claim 1, wherein the magnetic metal layer contains an alloy $Co_{1-x}Fe_x$, where x is smaller than 0.5.

6. The magnetoresistance effect element according to claim 5, wherein the magnetic metal layer contains an alloy $Co_{1-x}Fe_x$, where x is smaller than 0.3.

7. The magnetoresistance effect element according to claim 1, wherein the magnetic metal layer is formed of an alloy $Co_{1-x-y}Fe_xNi_y$, where (x+y) is smaller than 0.5.

8. The magnetoresistance effect element according to claim 7, wherein the magnetic metal layer is formed of an alloy $Co_{1-x-y}Fe_xNi_y$, where (x+y) is smaller than 0.3.

9. The magnetoresistance effect element according to claim 1, wherein the magnetic layer has a thickness falling within a range of between 2 and 50 Å.

10. The magnetoresistance effect element according to claim 1, wherein the nonmagnetic layer has a thickness falling within a range of between 2 and 100 Å.

11. The magnetoresistance effect element as claimed in claim 1, wherein said magnetic and non-magnetic metal layers are each 10 Å thick.

12. The magnetoresistance effect element as claimed in claim 11, wherein said magnetic metal layers consist of Co and said non-magnetic metal layers consist of Cu.

13. The magnetoresistance effect element as claimed in claim 1, wherein said magnetic metal layers consist of Co and said non-magnetic metal layers consist of Cu.

14. The magnetoresistance effect element as claimed in claim 1, wherein said artificial lattice film multilayer is formed by epitaxial growth.

* * * * *